US012666690B2

(12) United States Patent
Chen et al.

(10) Patent No.: US 12,666,690 B2
(45) Date of Patent: Jun. 23, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Kuo-Ju Chen, Taichung City (TW); Te-Jui Yen, Hsinchu City (TW); Liang-Yin Chen, Hsinchu City (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 341 days.

(21) Appl. No.: 18/487,317

(22) Filed: Oct. 16, 2023

(65) Prior Publication Data

US 2025/0126874 A1 Apr. 17, 2025

(51) Int. Cl.
| | |
|---|---|
| *H10D 64/66* | (2025.01) |
| *H10D 30/01* | (2025.01) |
| *H10D 30/43* | (2025.01) |
| *H10D 30/67* | (2025.01) |

(Continued)

(52) U.S. Cl.
CPC ......... *H10D 64/679* (2025.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/0112* (2026.01); *H10D 64/01326* (2026.01)

(58) Field of Classification Search
CPC .... H10D 64/679; H10D 30/014; H10D 30/43; H10D 30/6729; H10D 30/6735; H10D 62/121; H10D 64/01; H10D 30/6757; H01L 21/28123; H01L 21/28518; H01L 21/7682; H01L 21/76825
See application file for complete search history.

(56) References Cited

U.S. PATENT DOCUMENTS

| | | | |
|---|---|---|---|
| 7,838,918 B2 * | 11/2010 | Naruse .............. | H01L 23/53238 257/292 |
| 2012/0126300 A1 * | 5/2012 | Park ..................... | H10B 12/315 257/296 |

(Continued)

*Primary Examiner* — Leonardo Andujar
(74) *Attorney, Agent, or Firm* — Birch, Stewart, Kolasch & Birch, LLP

(57) ABSTRACT

A method includes a number of operations. An interlayer dielectric (ILD) layer is formed over a source/drain region on a substrate. A source/drain contact extending through the ILD layer to electrically connect with the source/drain region is formed. An air gap extending through the ILD layer is formed. An implantation energy absorption dielectric layer is formed over the ILD layer. An implantation process is performed on the implantation energy absorption dielectric layer, wherein the implantation process causes the ILD layer expands to seal the air gap. A first implant-free dielectric layer is formed over the implantation energy absorption dielectric layer. A second implant-free dielectric layer is formed over the first implant-free dielectric layer. A source/drain via extending through the second implant-free dielectric layer, the first implant-free dielectric layer, and the implantation energy absorption dielectric layer to the source/drain contact is formed.

20 Claims, 34 Drawing Sheets

(51) Int. Cl.
  *H10D 62/10* (2025.01)
  *H10D 64/01* (2025.01)

(56) References Cited

U.S. PATENT DOCUMENTS

| 2014/0264479 | A1* | 9/2014 | Cai | ................... H10D 30/0223 |
| | | | | 257/288 |
| 2017/0162650 | A1* | 6/2017 | Cheng | ............... H10D 30/6219 |
| 2018/0006086 | A1* | 1/2018 | Chiu | ...................... H10B 63/20 |

* cited by examiner 223
221

208

100

218

216

221

211
204C
204B
204A
230

202C
202B
202A

203

232

100

204C
204B
204A

208

100

236
234
204C
204B
204A
230

238

221

232

100

204C

204B

204A

242

244

246

240

208

100

100

236

234

204C

204B

204A

230

221

232

242   244   246

240

500

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
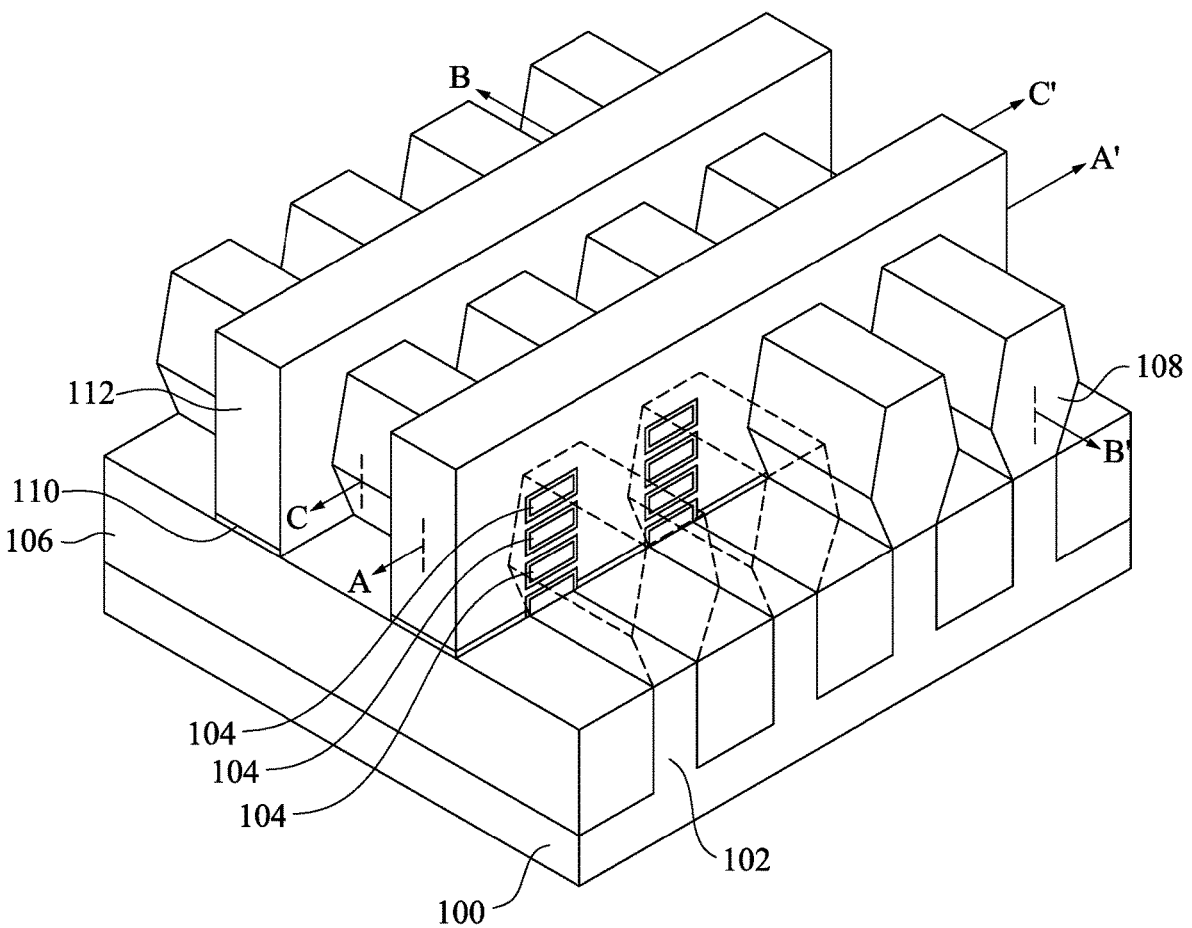
FIG. 1 illustrates an example of gate-all-around field-effect transistors (GAA-FETs) in a three-dimensional view according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The present disclosure is generally related to integrated circuit (IC) structures and methods of forming the same, and more particularly to fabricating gate-all-around (GAA) transistors, planar transistors, and/or fin field effect transistors (FinFET). It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

In order to improve device speed, an air-gap is formed in the dielectric between source/drain contact and metal gate, which can effectively reduce effective capacitance between these metal structures. In particular, after forming a source/drain contact (also called metal over diffusion "MD") in an interlayer dielectric (ILD), air gaps are formed in the ILD by etching, and then a dielectric is deposited over the ILD while keeping the air gaps unfilled. An ion implantation process is then performed on the dielectric. The ion implantation process serves to cause expansion of the ILD, thus sealing off the air gaps in the ILD. After forming the sealed air gaps in the ILD, source/drain vias (also called "VD") and gate contacts (also called "VG") are formed through the dielectric. However, the ion implantation process may cause unwanted damages to epitaxial materials of source/drain regions and/or unwanted damages to the channel regions, even if the dielectric can serve as an implantation energy absorption layer.

Embodiments of the present disclosure thus provide an ion implantation process with a reduced energy/dosage is employed to seal the air gaps. In order to allow the ILD has sufficient expansion caused by the low energy/dosage implantation, embodiments of the present disclosure further provide a thinner implantation energy absorption dielectric over the ILD. Moreover, after the ion implantation is completed, embodiments of the present disclosure further provide one or more dielectric layers deposited over the implantation energy absorption dielectric to form a multi-layer dielectric film over the ILD. The multi-layer dielectric film allows for the subsequently formed source/drain vias and gate contacts to have an acceptable height, even if a thinner implantation energy absorption dielectric is used in the low energy/dosage implantation.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nanoscale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectric layers 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 of the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2 through 28 are cross-sectional views and top views of intermediate stages in the manufacturing of GAA-FETs, in accordance with some embodiments. FIGS. 2 through 5, 6A, 13A, 14A, 15A, 16A, 17A and 19 through 28 illustrate reference cross-section A-A' illustrated in FIG. 1 that extends through a gate region along a longitudinal axis of the gate region. FIGS. 6B, 7B, 8B, 9B, 10B, 11B, 11C, 12B, 12D, 13B, 14B, 15B, 15B, 16B and 17B illustrate reference cross-section B-B' illustrated in FIG. 1 that extends through a fin along a longitudinal axis of the fin. FIGS. 7A, 8A, 9A, 10A, 11A, 12A, 12C, and 13C illustrate reference cross-section C-C' illustrated in FIG. 1 that extends through source/drain regions along the longitudinal direction of the gate region.

Figure 2:
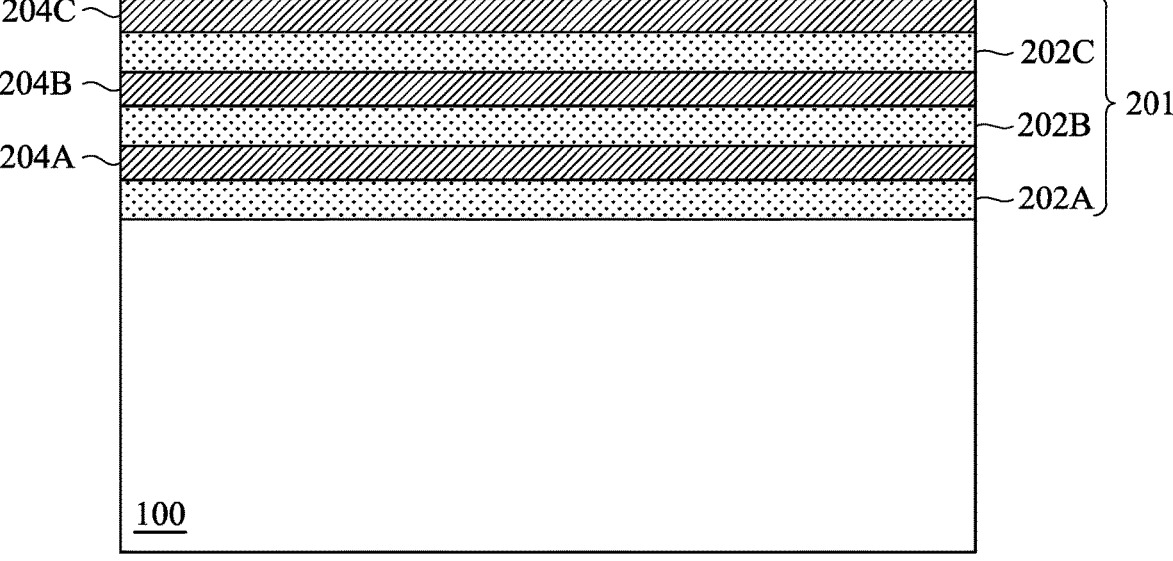
FIGS. 2 through 5, 6A, 13A, 14A, 15A, 16A, 17A and 18 through 27 illustrate reference cross-section A-A' illustrated in FIG. 1 that extends through a gate region along a longitudinal axis of the gate region.

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Further in FIG. 2, a multi-layer stack 201 is formed over the substrate 100. The multi-layer stack 201 includes alternating layers of first semiconductor layers 202A-C (collectively referred to as first semiconductor layers 202) and second semiconductor layers 204A-C (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The multi-layer stack 201 is illustrated as including three layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

5

Figure 3:
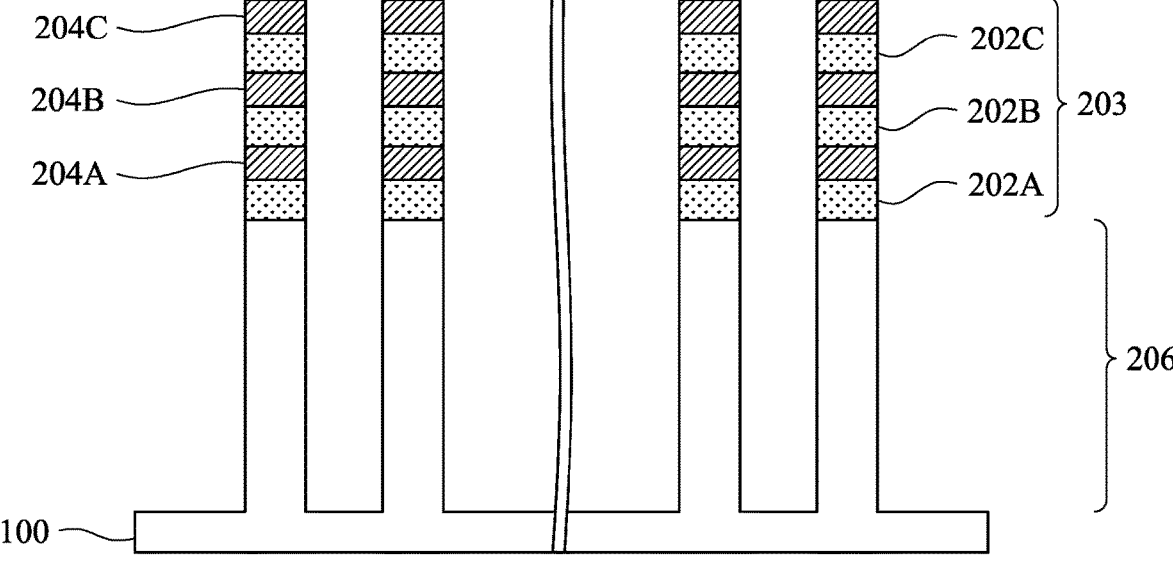

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 203 can be collectively referred to as a semiconductor fin extending from the substrate 100. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-C (collectively referred to as the first nanostructures 202) from the first semiconductor layers 202 and define second nanostructures 204A-C (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206. While each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

Figure 4:
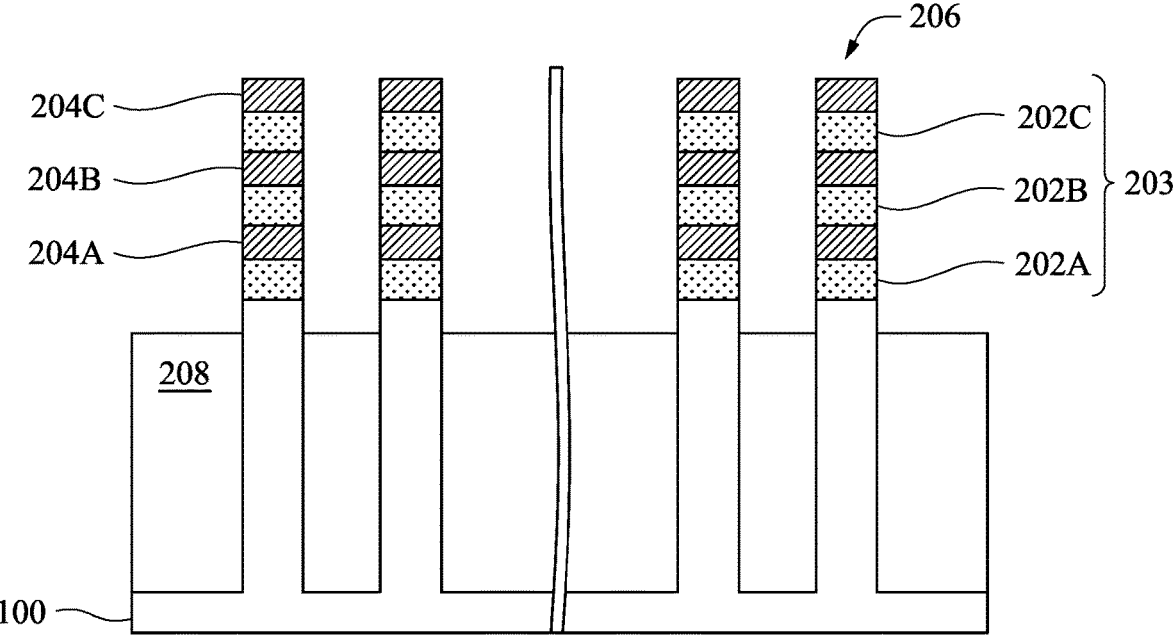

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostructures 203 such that top surfaces of the nanostructures 203 and the insulation material are level after the planarization process is complete.

The insulation material is then recessed to form the STI regions 208. The insulation material is recessed such that upper portions of fin structures 206 protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fin structures 206 and/or the nanostructures 203. In some embodiments with different well types in different device regions (e.g., NFET region and PFET region), different implant steps may be achieved using a photoresist or other masks (not separately illustrated). For example, a photoresist may be formed over the fin structures 206 and the STI regions 208 in the NFET region and the PFET region. The photoresist is patterned to expose the PFET region. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the PFET region, and the photoresist may act as a mask to substantially prevent the first impurities from being implanted into the NFET region. After the implant, the photoresist is removed, such as by an acceptable ashing process.

Following or prior to the implanting of the PFET region, a photoresist or other masks (not separately illustrated) is formed over the fin structures 206, the nanostructures 203, and the STI regions 208 in the NFET region and the PFET region. The photoresist is then patterned to expose the NFET region. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the NFET region, and the photoresist may act as a mask to substantially prevent p-type impurities from being implanted into the PFET region. After the implant, the photoresist may be removed, such as by an acceptable ashing process.

After one or more well implants of the NFET region and PFET region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
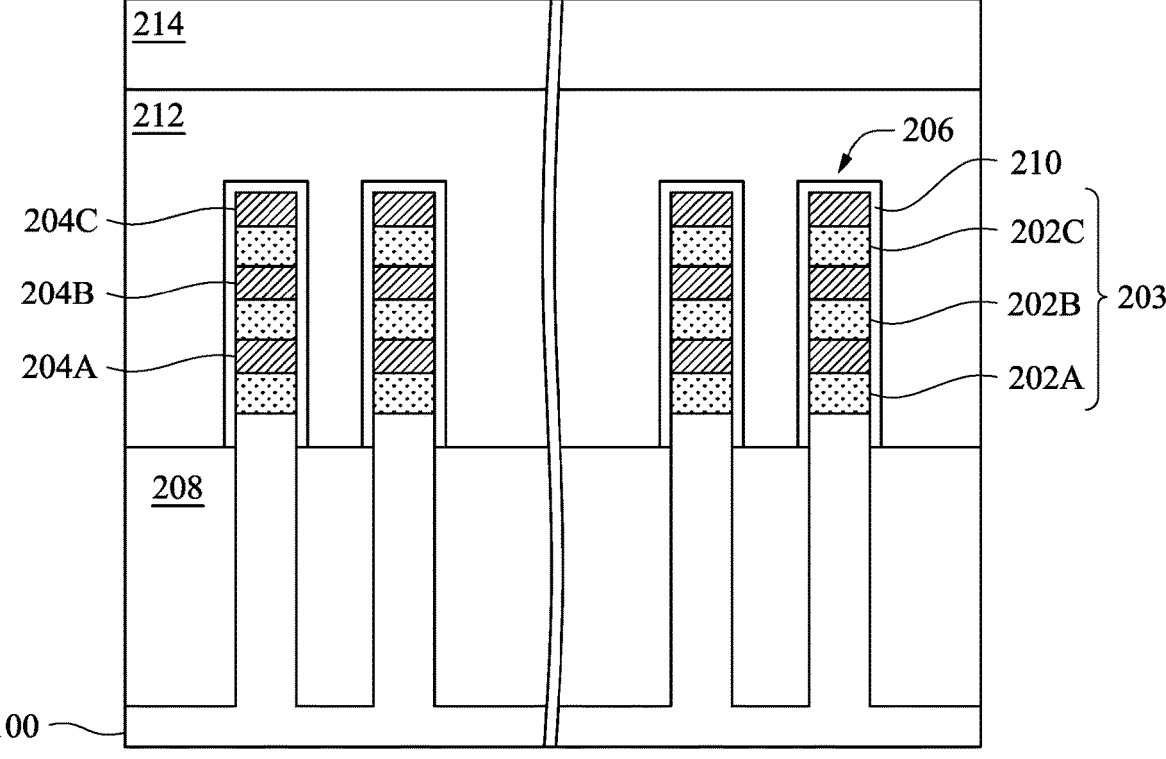

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6A:
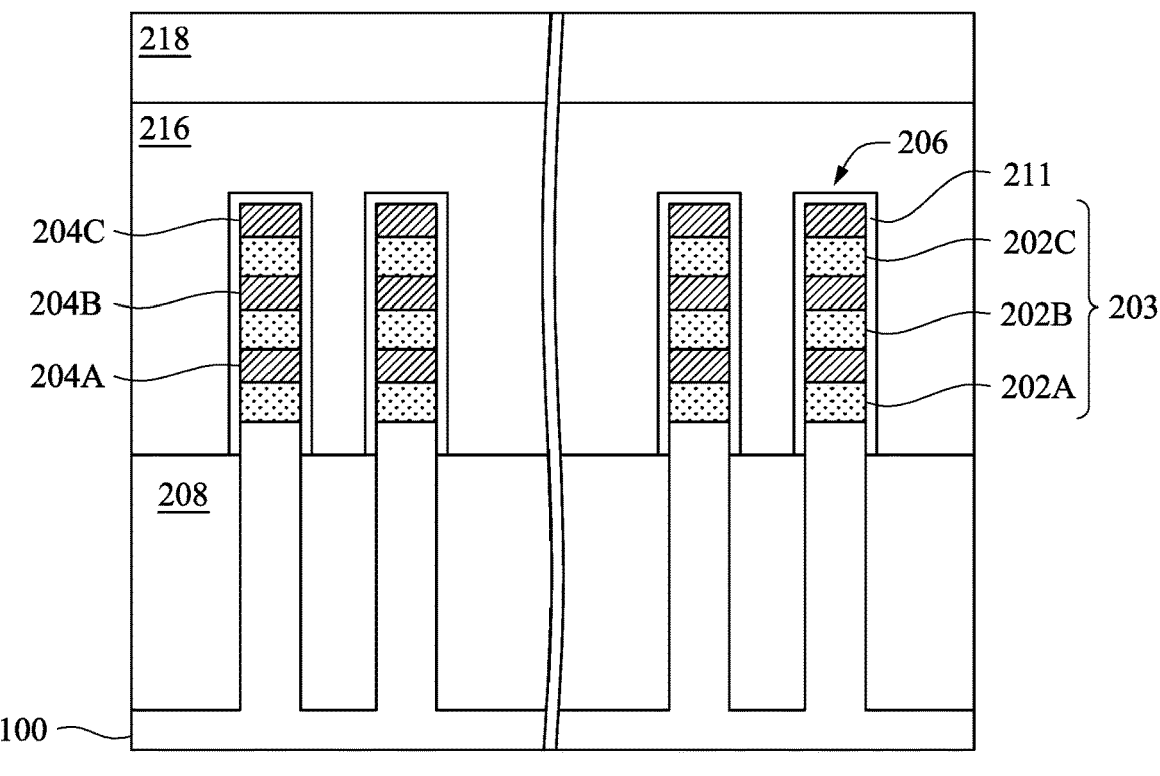
Figure 6B:
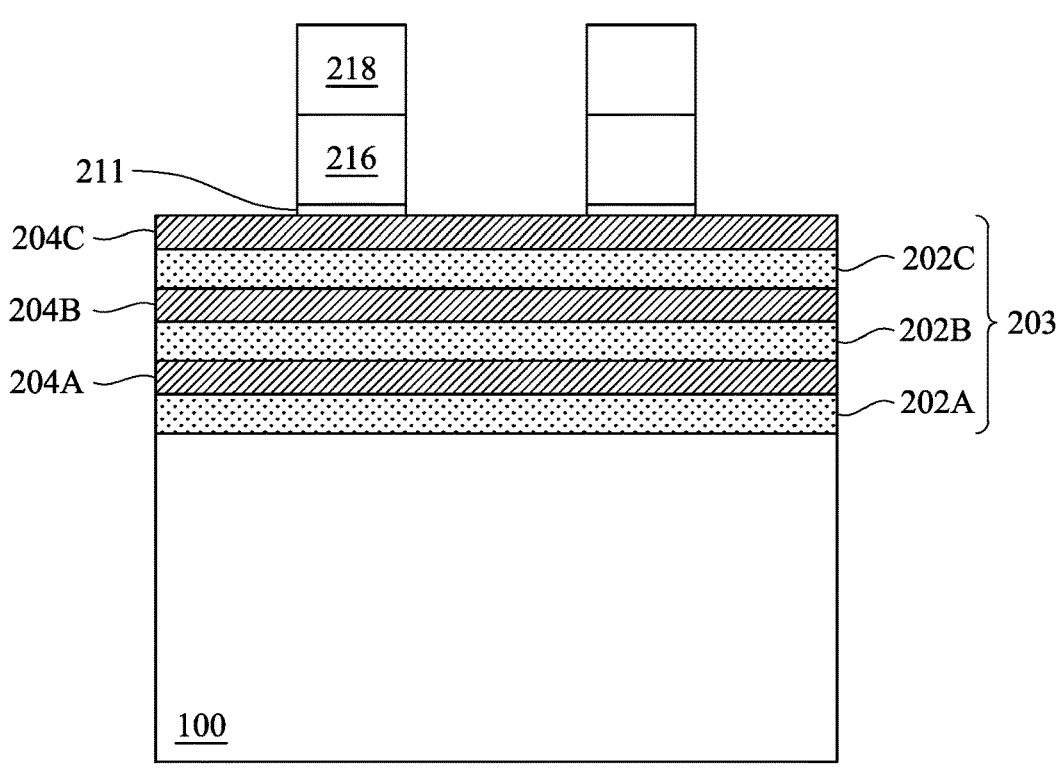
FIGS. 6B, 7B, 8B, 9B, 10B, 11B, 11C, 12B, 12D, 13B, 14B, 15B, 16B and 17B illustrate reference cross-section B-B' illustrated in FIG. 1 that extends through a fin along a longitudinal axis of the fin.

In FIGS. 6A and 6B, the mask layer 214 (see FIG. 5) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

Figure 7A:
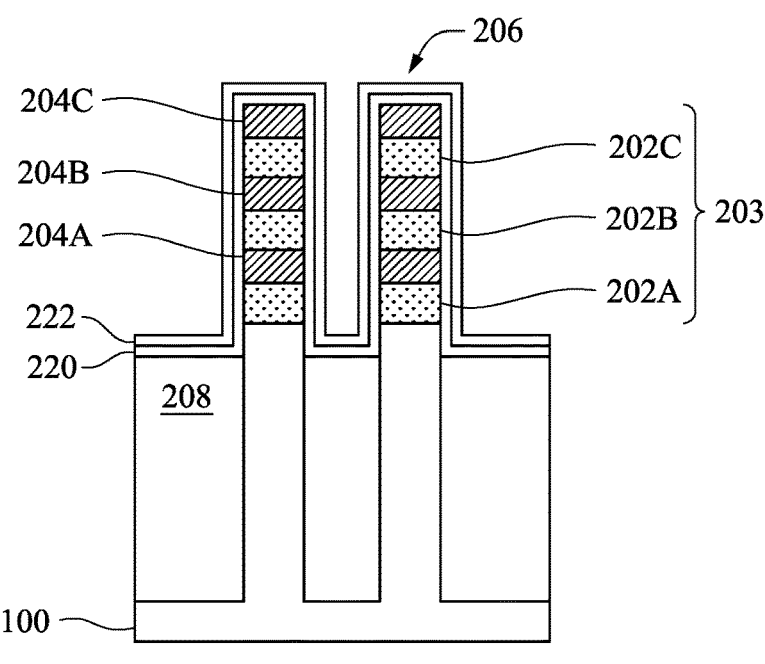
FIGS. 7A, 8A, 9A, 10A, 11A, 12A, 12C, and 13C illustrate reference cross-section C-C' illustrated in FIG. 1 that extends through source/drain regions along the longitudinal direction of the gate region.
Figure 7B:
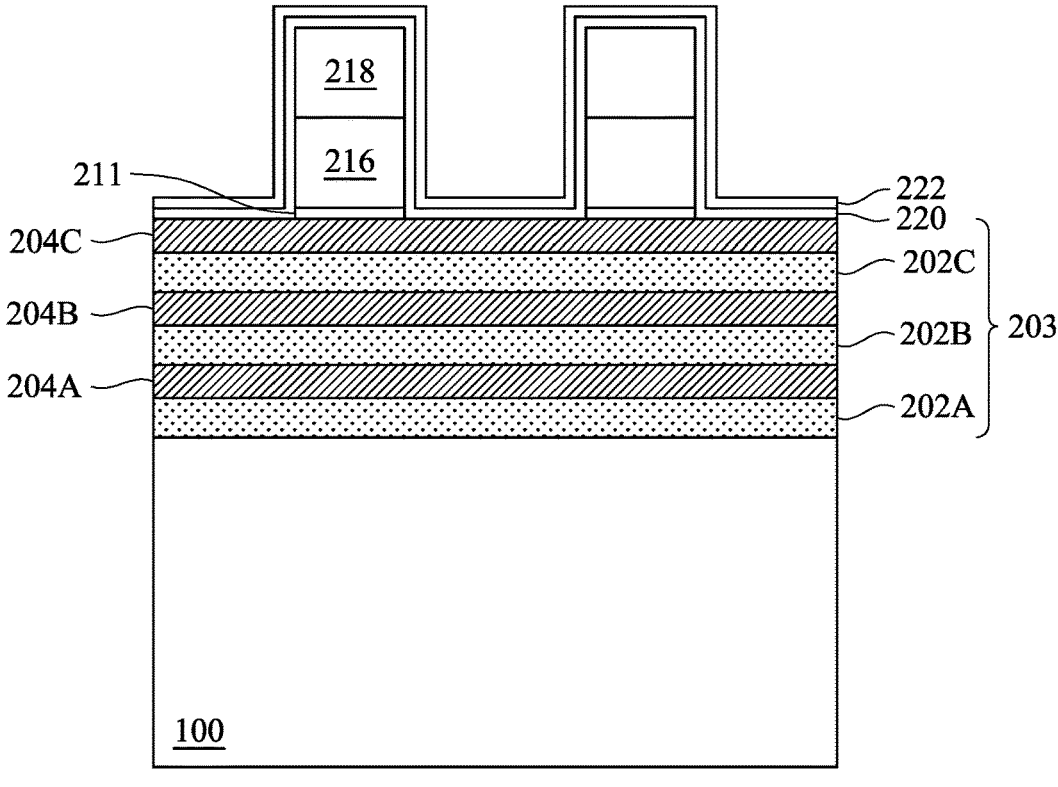

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalls of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8A:
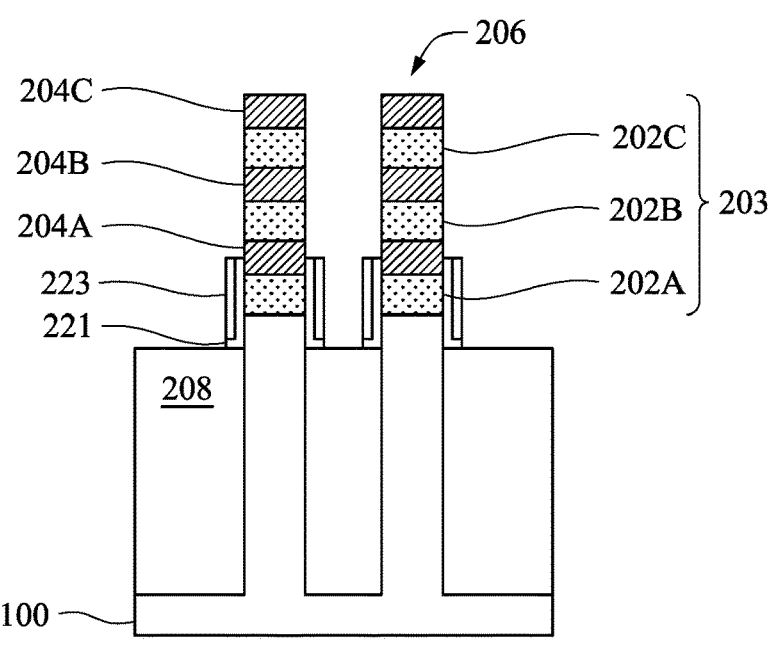
Figure 8B:
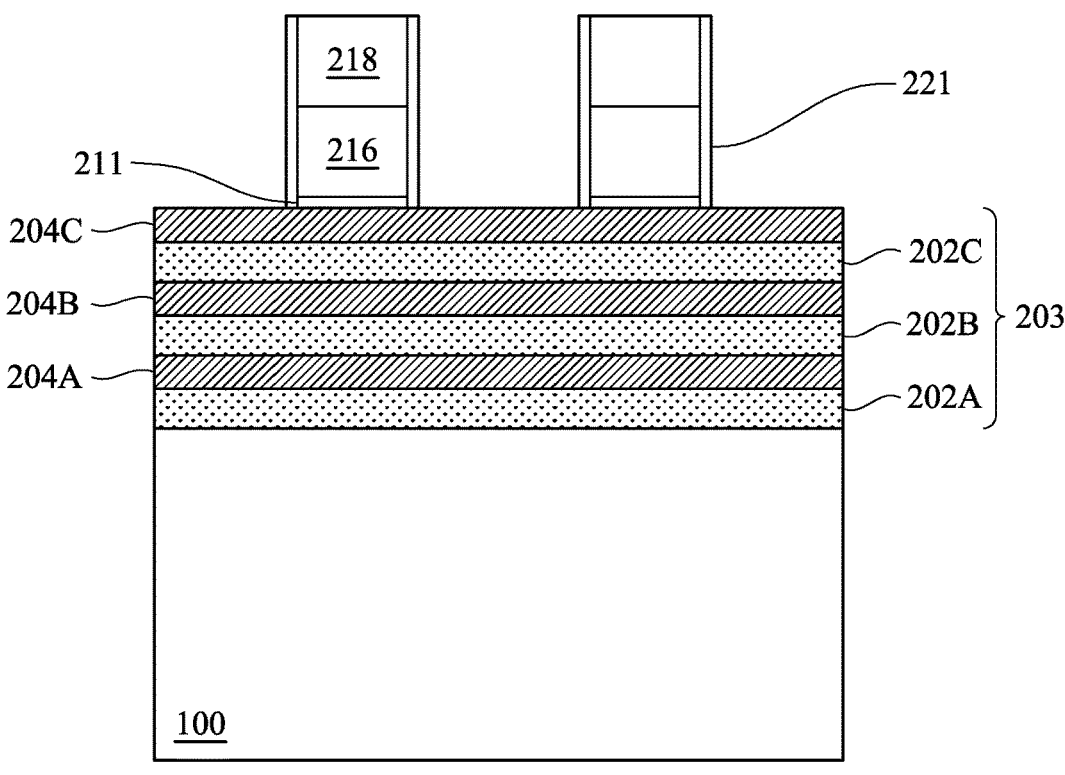

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source and drain regions (collectively referred to as source/drain regions), as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy dielectric layers 211. In other embodiments, a portion of the second spacer layer 222 may remain over the first spacer layer 220 adjacent the masks 218, the dummy gates 216, and the dummy gate dielectrics 211.

In some embodiments, the first spacers 221 on gate sidewalls (also called gate spacers) have a small thickness (e.g., in a range from about 1 nm to about 10 nm) so as to reduce gate-to-gate pitch without significant reduction in source/drain region size. In some embodiments, the first spacers 221 on gate sidewalls is formed of as low-dielectric constant (low-k) materials (e.g., porous silicon oxide) having a k-value, for example, less than about 3.5. The low-k material can aid in reducing parasitic capacitance between, for example, the subsequently formed metal gates and source/drain contacts.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like.

Figure 9A:
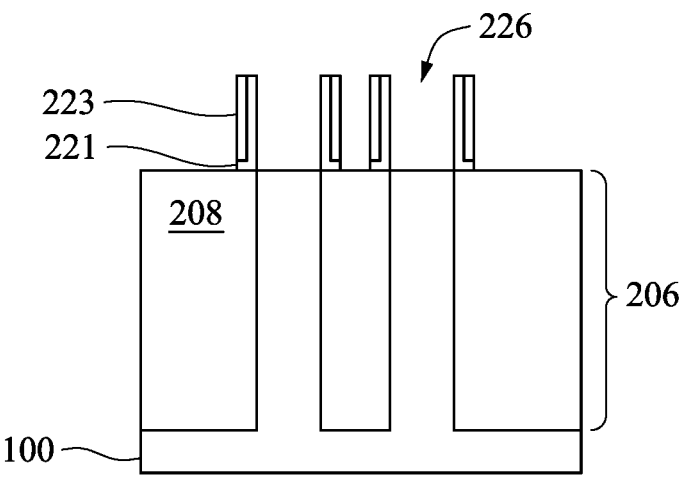
Figure 9B:
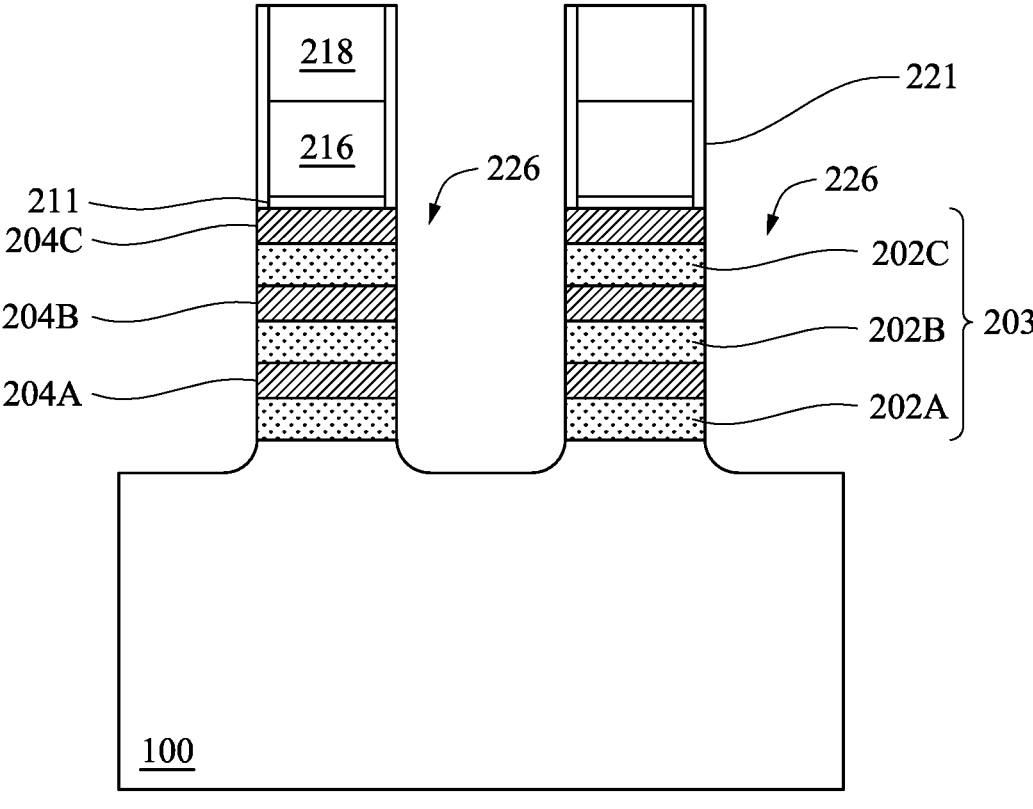

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 208, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10A:
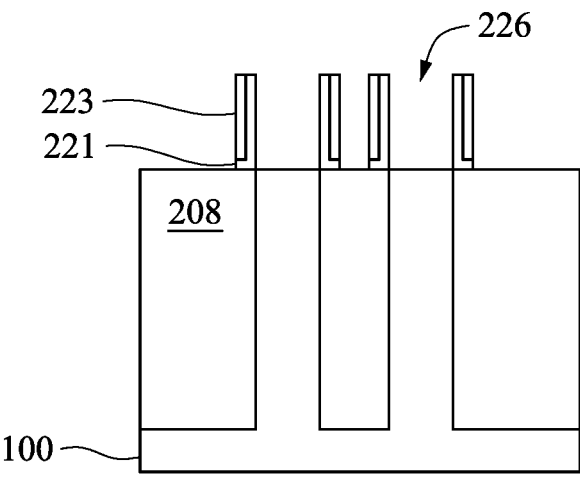
Figure 10B:
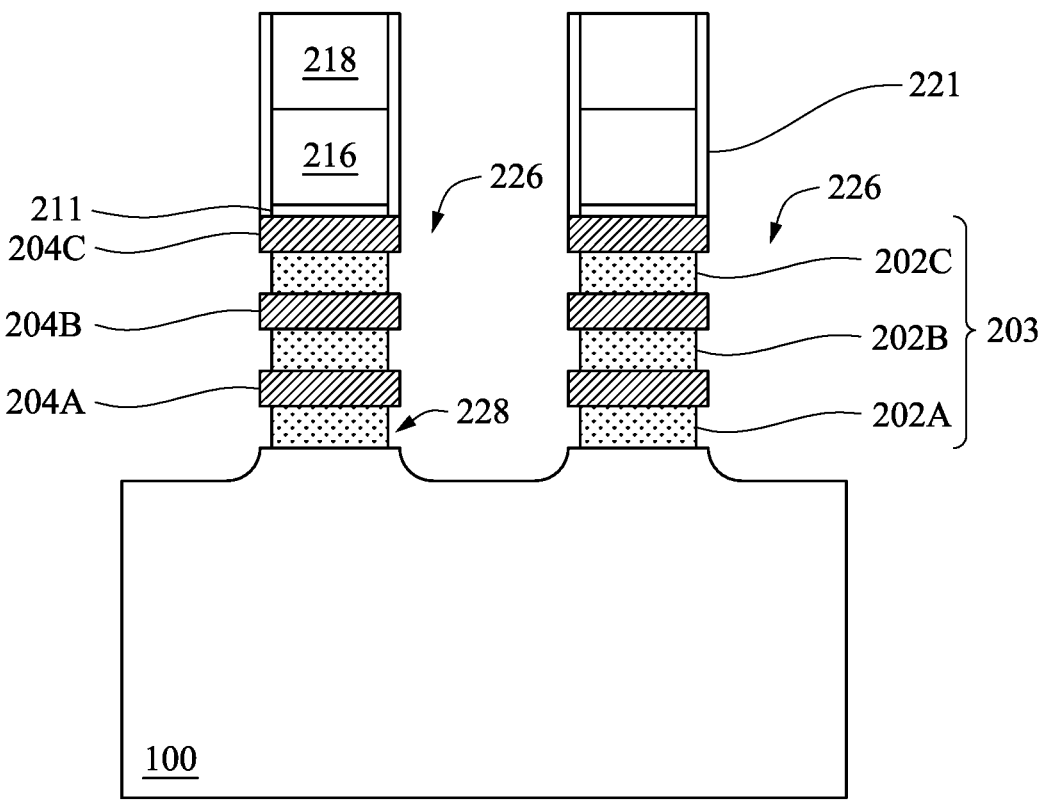

In FIGS. 10A and 10B, portions of sidewalls of the layers of the multi-layer stack nanostructures 203 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide ($NH_4OH$), or the like may be used to etch sidewalls of the first nanostructures 202.

Figure 11A:
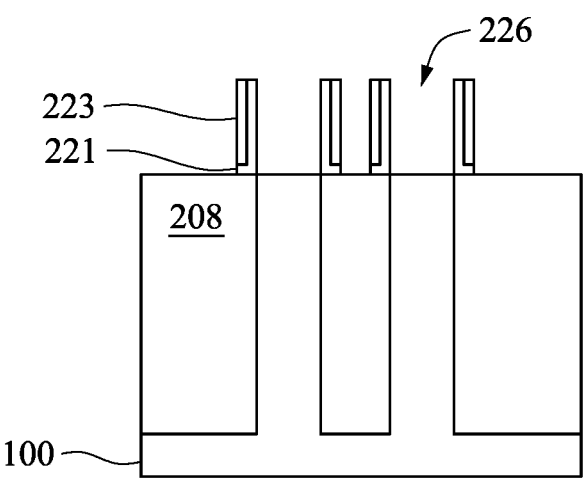
Figure 11B:
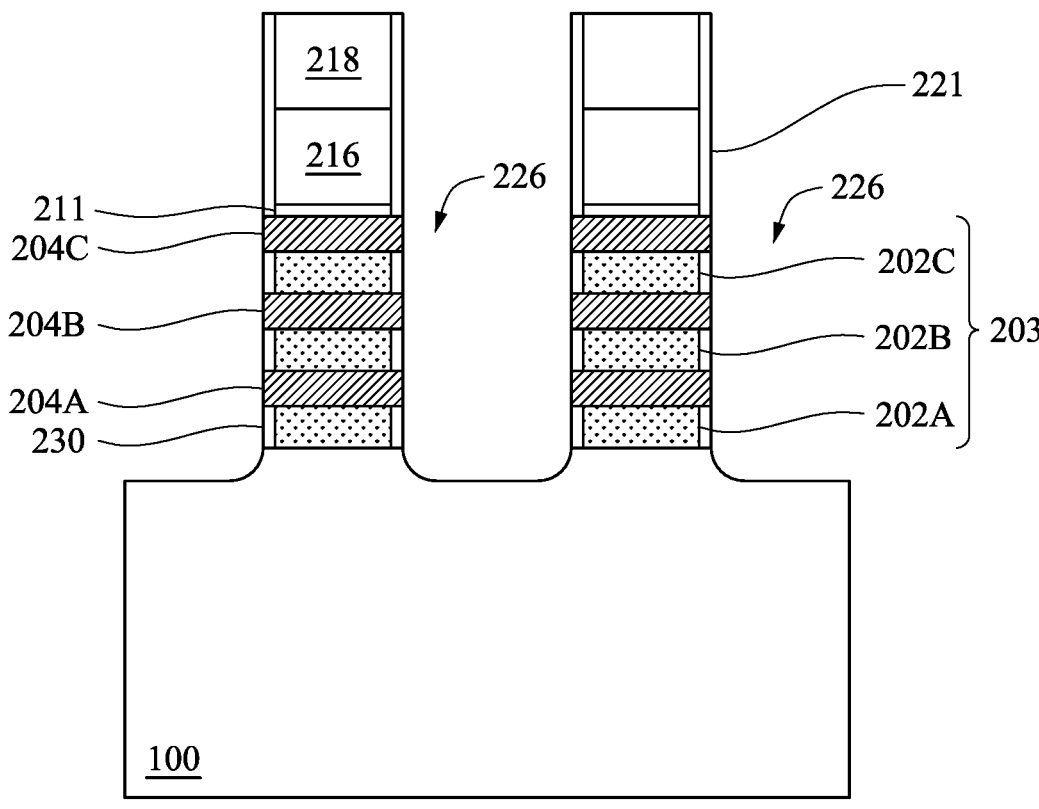
Figure 11C:
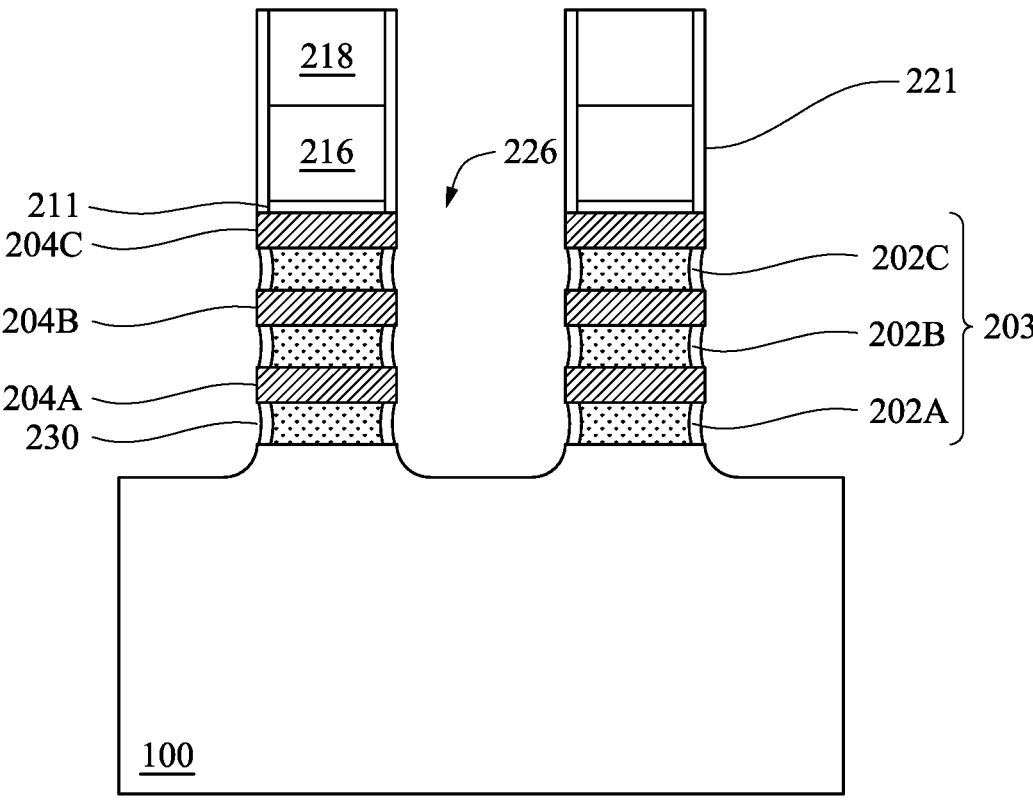

In FIGS. 11A-11C, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. As an example, FIG. 11C illustrates an embodiment in which sidewalls of the first nanostructures 202 are concave, outer sidewalls of the inner spacers 230 are concave, and the inner spacers are recessed from sidewalls of the second nanostructures 204. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 12A-12D) by subsequent etching processes, such as etching processes used to form gate structures.

Figure 12A:
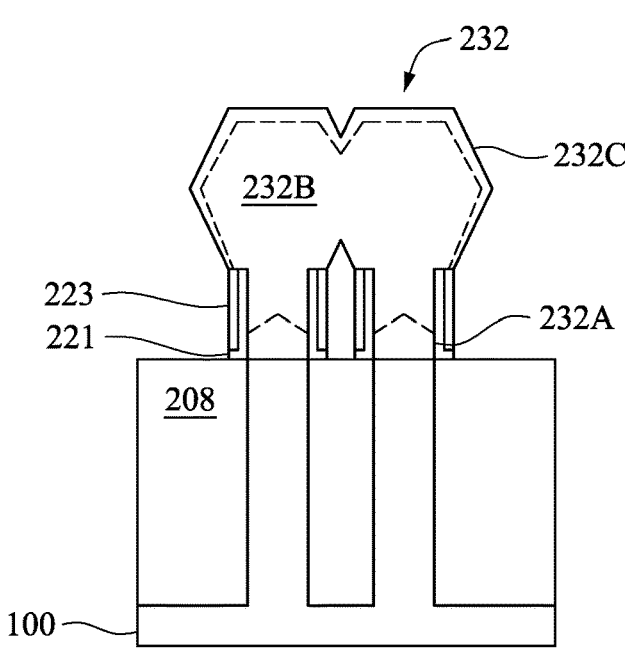
Figure 12B:
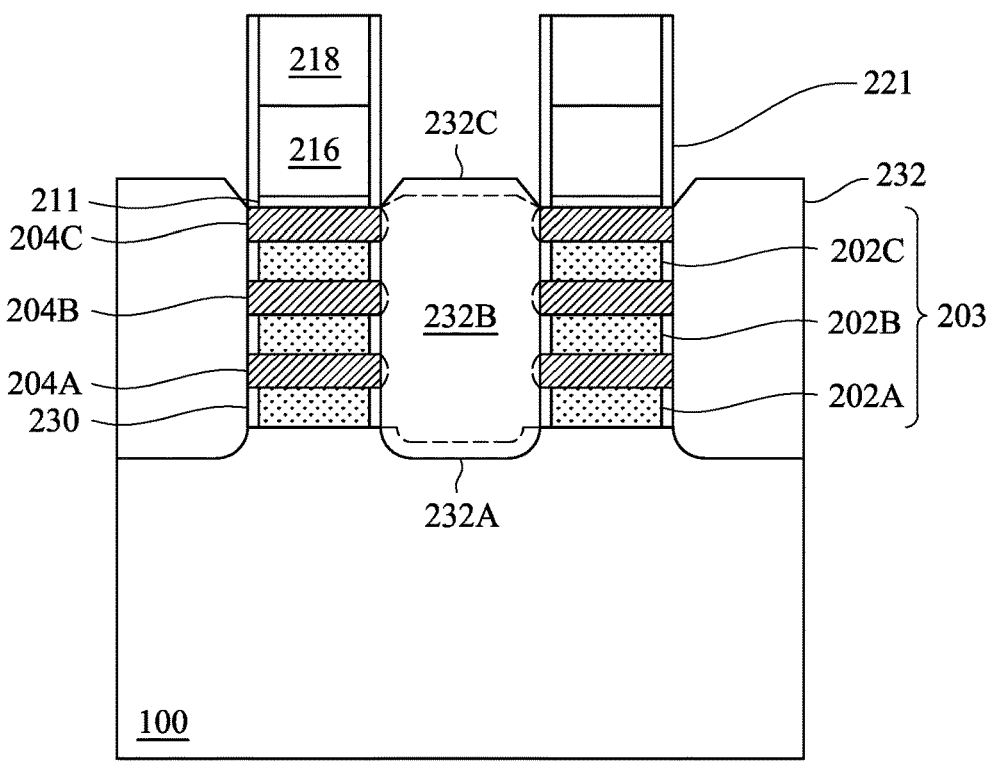

In FIGS. 12A-12D, epitaxial source/drain regions 232 are formed in the source/drain recesses 226. In some embodiments, the source/drain regions 232 may exert stress on the second nanostructures 204, thereby improving device performance. As illustrated in FIG. 12B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 212, and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The source/drain regions may have an impurity concentration of between about $1 \times 10^{17}$ atoms/cm$^3$ and about $1 \times 10^{22}$ atoms/cm$^3$. The n-type and/or p-type impurities for source/drain regions may be any of the impurities previously discussed. In some embodiments, the epitaxial source/drain regions 232 may be in situ doped during growth.

Figure 12C:
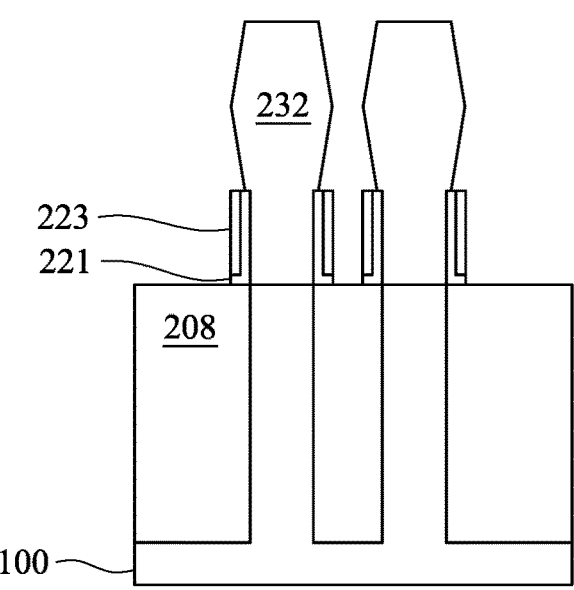

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 12A. In some other embodiments, adjacent epitaxial source/drain regions 232 remain separated after the epitaxy process is completed as illustrated by FIG. 12C. In the embodiments illustrated in FIGS. 12A and 12C, the first spacers 221, 223 may be formed to a top surface of the STI regions 208 thereby blocking the lateral epitaxial growth. In some other embodiments, the spacer etch used to form the first spacers 221, 223 may be adjusted to remove the spacer material to allow the epitaxially grown region to extend to the surface of the STI region 208.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C, which are distinguished in FIGS. 12A and 12B by using dash lines. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

Figure 12D:
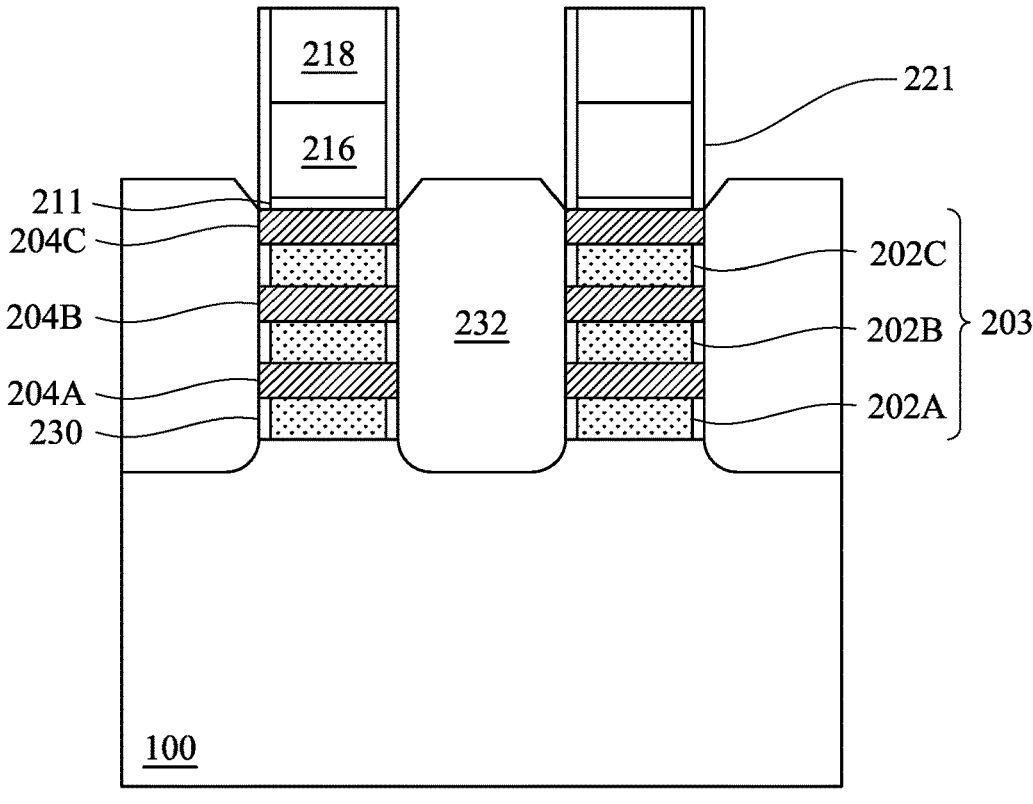

FIG. 12D illustrates an embodiment in which sidewalls of the first nanostructures 202 are concave, outer sidewalls of the inner spacers 230 are concave, and the inner spacers 230 are recessed from sidewalls of the second nanostructures 204. As illustrated in FIG. 12D, the epitaxial source/drain regions 232 may be formed in contact with the inner spacers 230 and may extend past sidewalls of the second nanostructures 204.

Figure 13A:
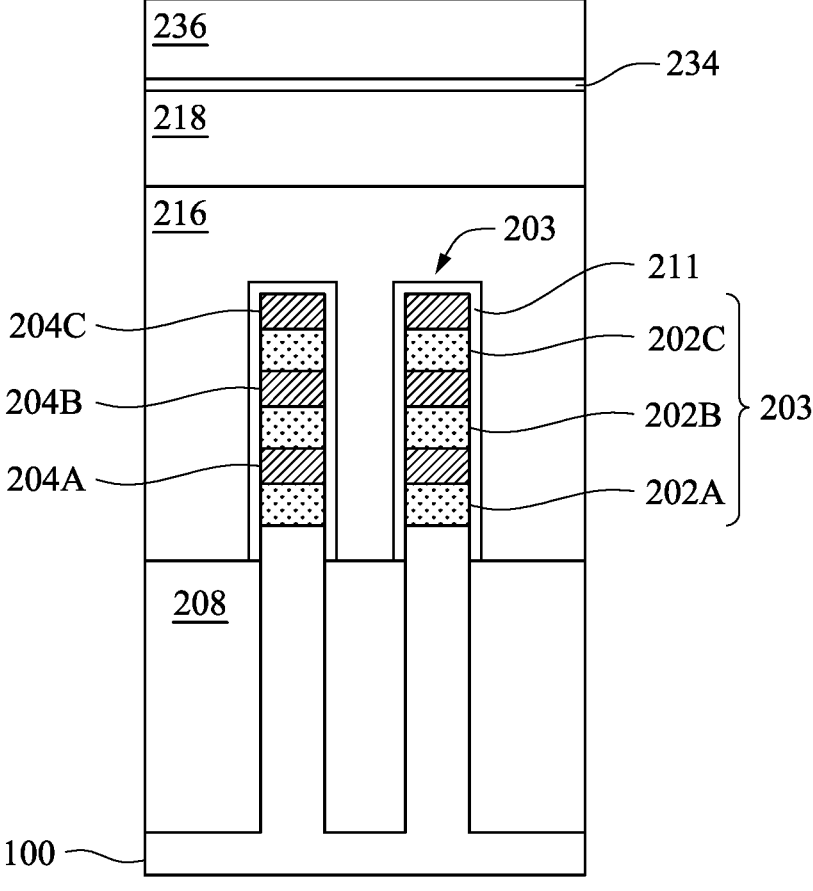
Figure 13B:
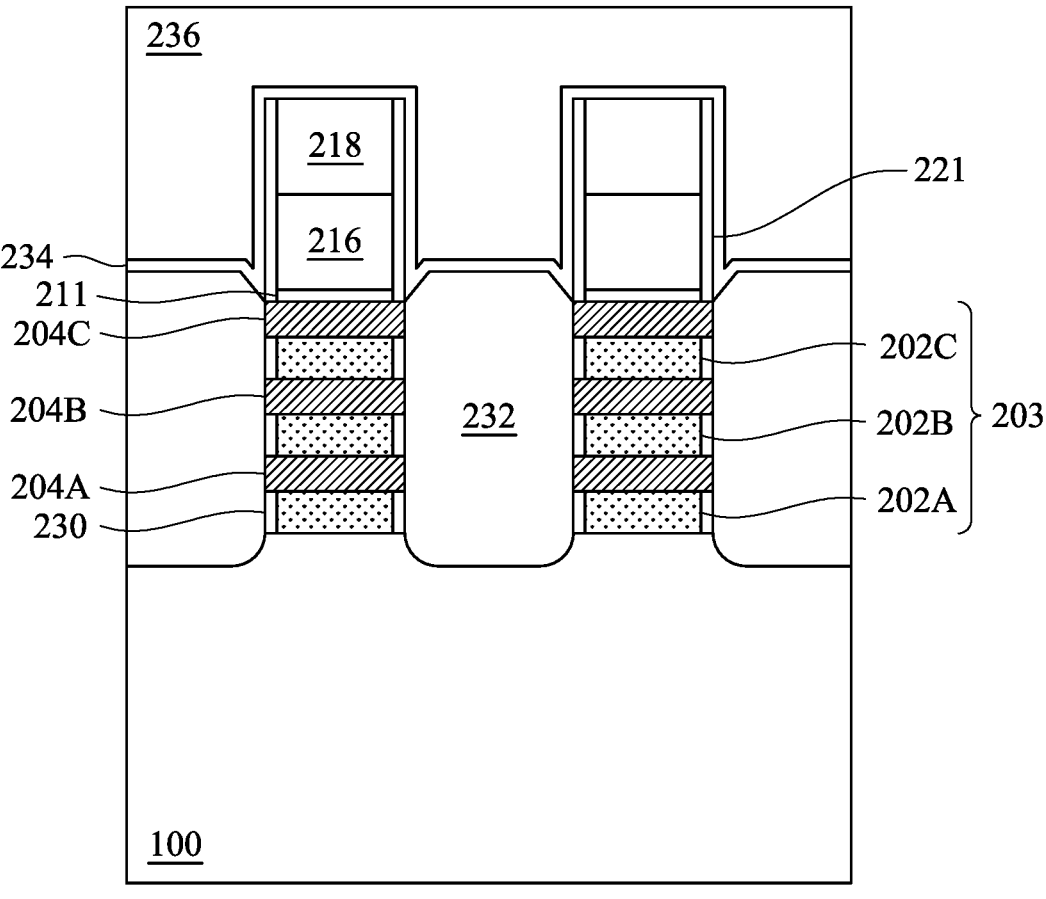
Figure 13C:
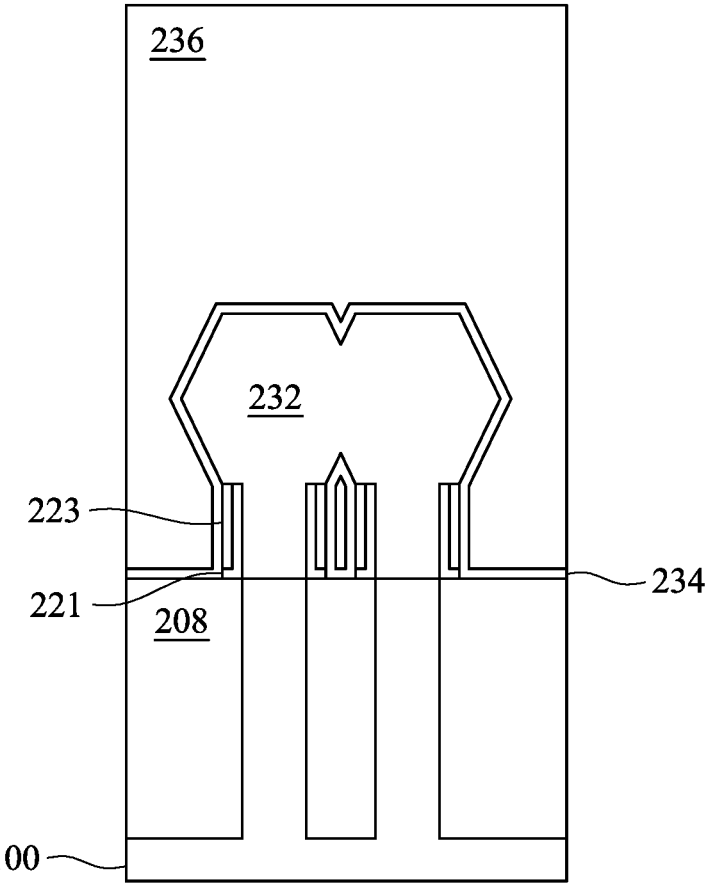

In FIGS. 13A-13C, an interlayer dielectric (ILD) layer 236 is deposited over the structure illustrated in FIGS. 12A-12D. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 214, and the first spacers 221. The CESL 234 may comprise a dielectric material, such as, SiN, SiO$_x$, SiCN, SiON, SiOCN, Al$_2$O$_3$, HfO$_2$, ZrO$_2$, HfAlO$_x$, and HfSiO$_x$, or the like, having a different etch rate than the material of the overlying ILD layer 236.

Figure 14A:
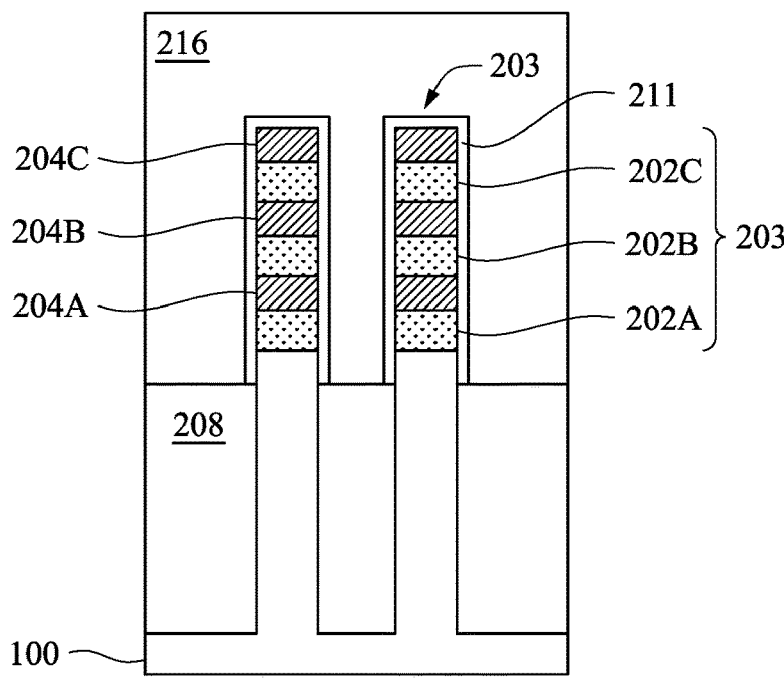
Figure 14B:
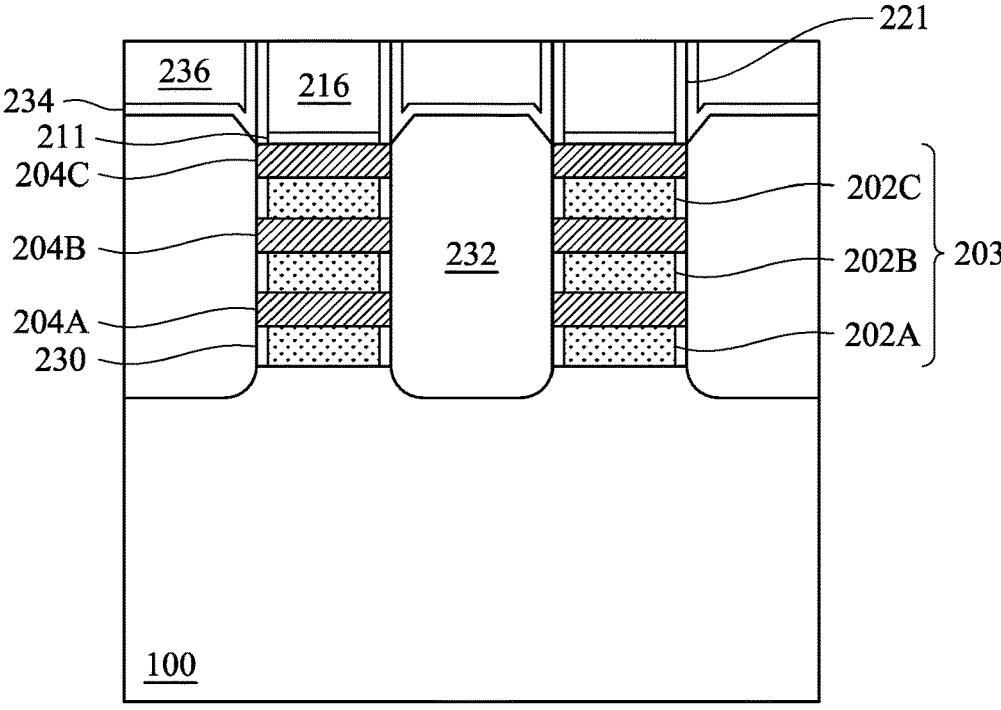

In FIGS. 14A-14B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After planarization process, top surfaces of the dummy gates 216, the first spacers 221, and the ILD layer 236 are level within process variations. Accordingly, the top surfaces of the dummy gates 212 are exposed through the ILD layer 236. In some embodiments, the masks 218 may remain, in which case the planarization process levels the top surface of the ILD layer 236 with top surface of the masks 218 and the first spacers 221.

Figure 15A:
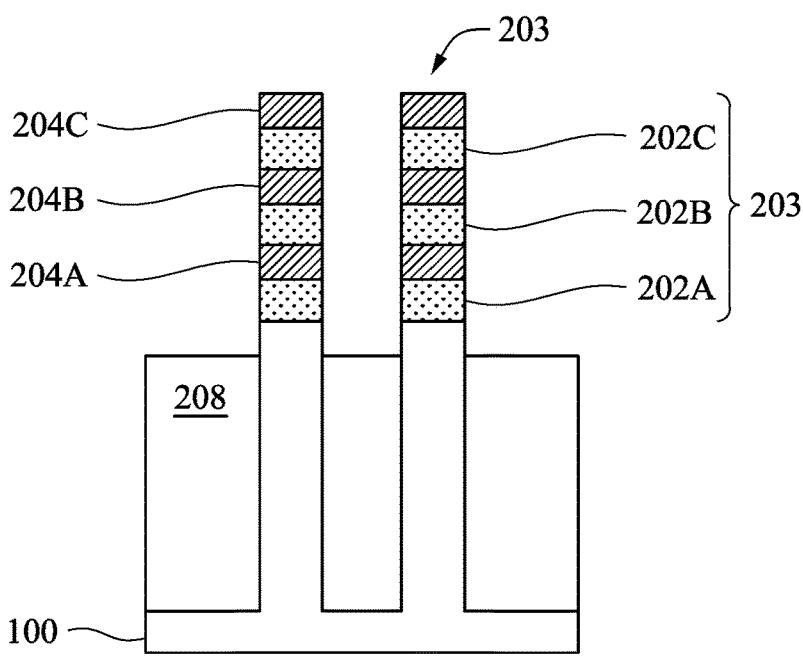
Figure 15B:
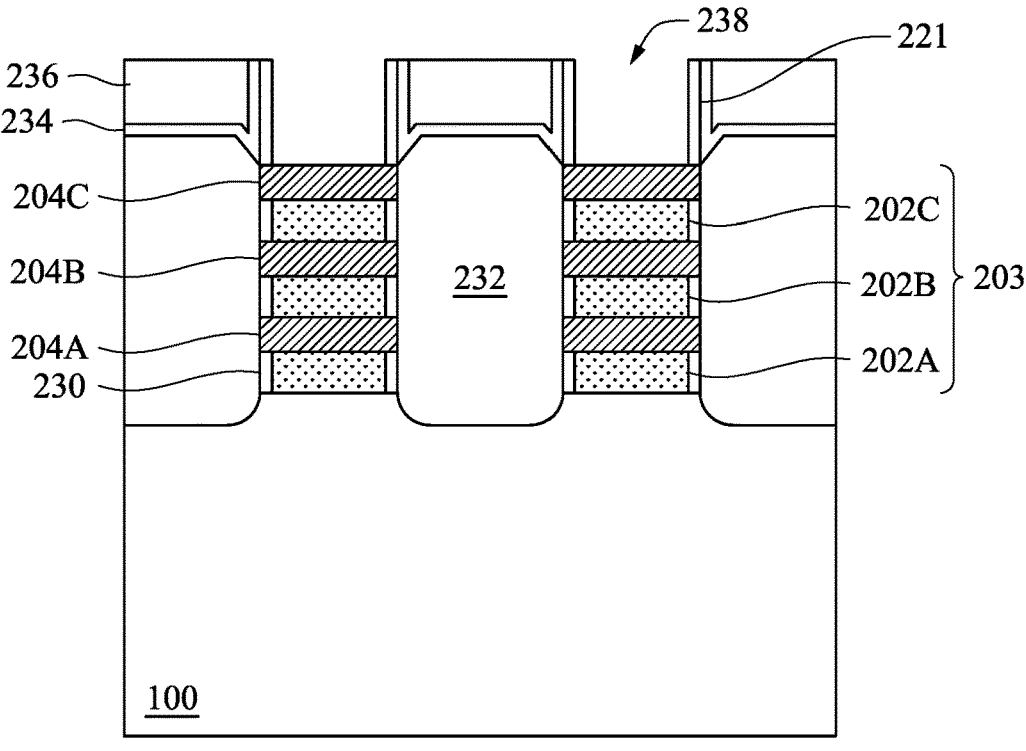

In FIGS. 15A and 15B, the dummy gates 216, and the masks 218 if present, are removed in one or more etching steps, so that gate trenches 238 are formed between corresponding gate spacers 221. In some embodiments, portions of the dummy gate dielectrics 211 in the gate trenches 238 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the first spacers 221. Each gate trench 238 exposes and/or overlies portions of nanostructures 204, which will serve as channel regions in subsequently completed GAA-FETs. The nanostructures 204 serving as the channel regions are disposed between neighboring pairs of the epitaxial source/drain regions 232. During the removal, the dummy dielectric layers 211 may be used as etch stop layers when the dummy gates 216 are etched. The dummy dielectric layers 211 may then be removed after the removal of the dummy gates 216.

Figure 16A:
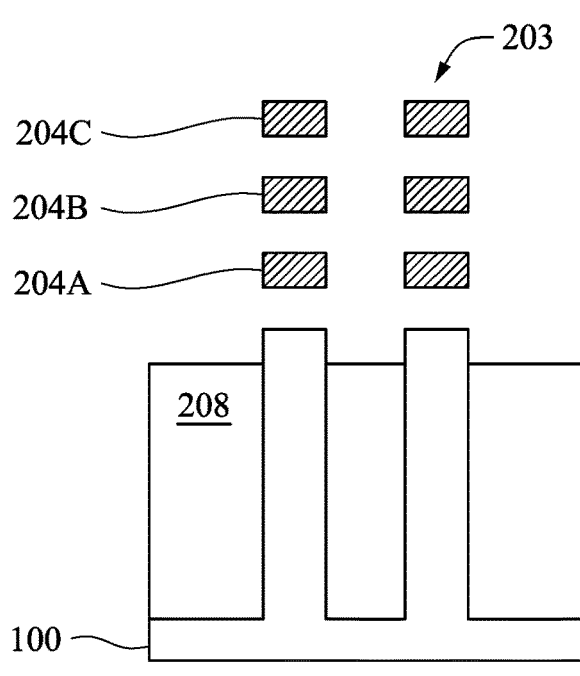
Figure 16B:
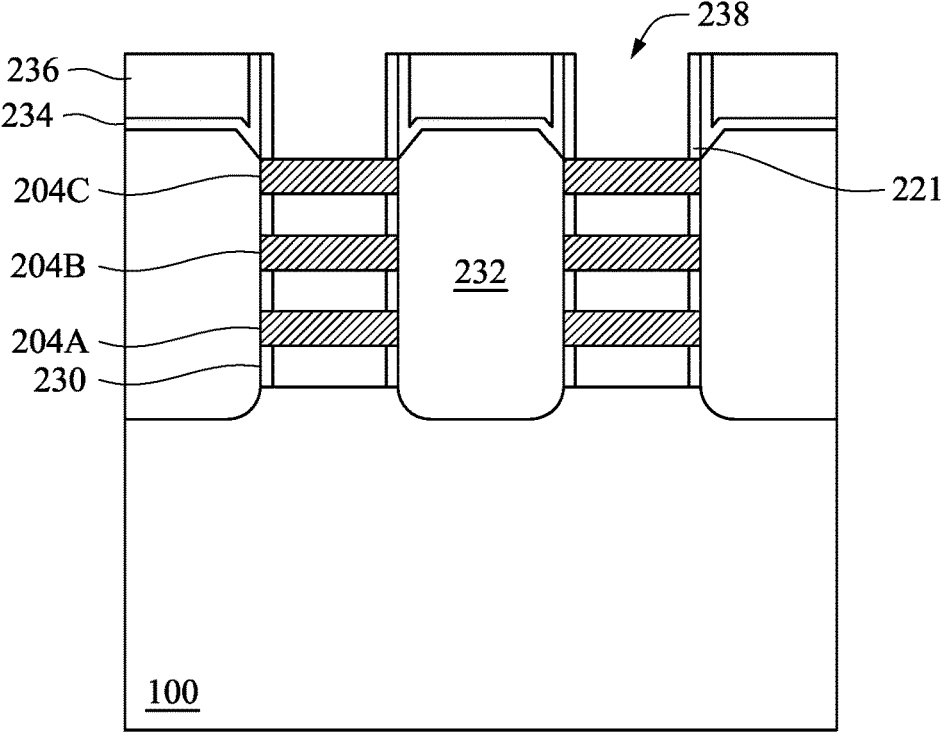

In FIGS. 16A and 16B, the first nanostructures 202 in the gate trenches are removed by an isotropic etching process such as wet etching or the like using etchants which are selective to the materials of the first nanostructures 202. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-to-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nanoscale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide (NH$_4$OH) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

Figure 17A:
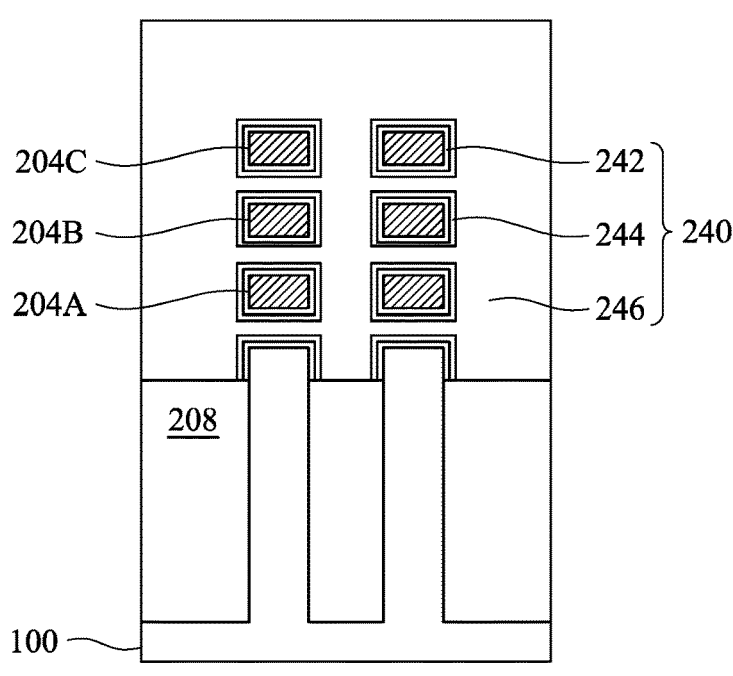
Figure 17B:
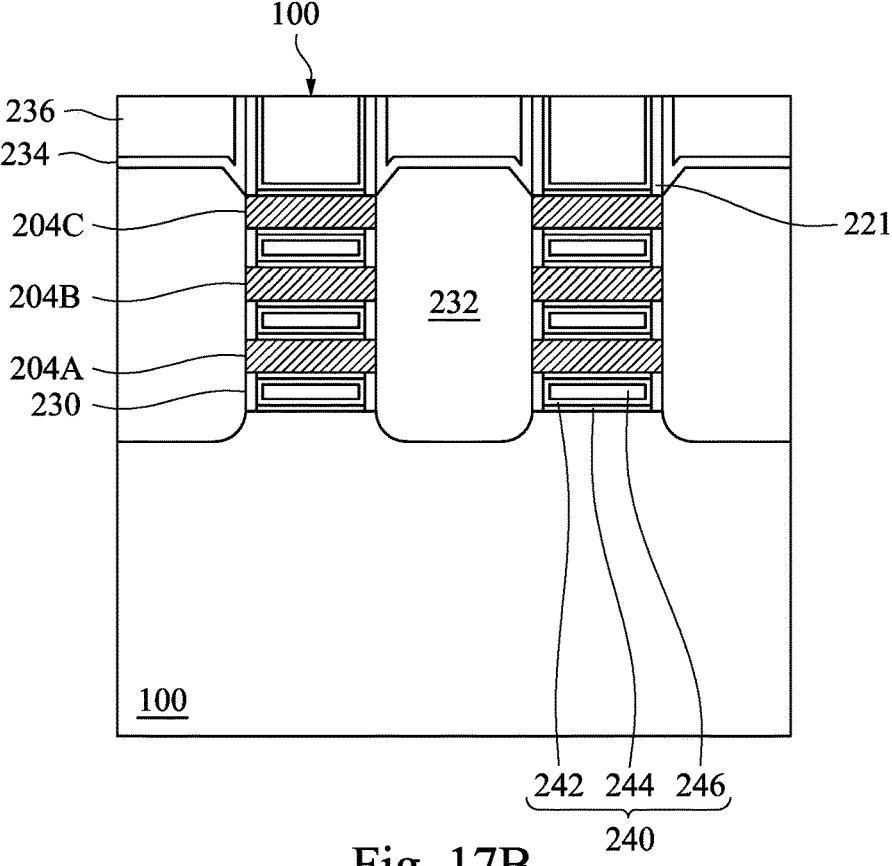

In FIGS. 17A and 17B, replacement gate structures 240 are respectively formed in the gate trenches 238 to surround each of the nanosheets 204 suspended in the gate trenches 238. The gate structures 240 may be final gates of GAA FETs. The final gate structure may be a high-k/metal gate stack, however other compositions are possible. In some embodiments, each of the gate structures 240 forms the gate associated with the multi-channels provided by the plurality of nanosheets 204. For example, high-k/metal gate structures 240 are formed within the sheet-to-sheet spaces provided by the release of nanosheets 204. In various embodiments, the high-k/metal gate structure 240 includes an interfacial layer 242 formed around the nanosheets 204, a high-k gate dielectric layer 244 formed around the interfacial layer 242, and a gate metal layer 246 formed around the high-k gate dielectric layer 244 and filling a remainder of gate trenches 238. Formation of the high-k/metal gate structures 240 may include one or more deposition processes to form various gate materials, followed by a CMP process to remove excessive gate materials, resulting in the high-k/metal gate structures 240 having top surfaces level with a top surface of the ILD layer 236. As illustrated in the cross-sectional view of FIG. 17A, the high-k/metal gate structure 240 surrounds each of the nanosheets 204, and thus is referred to as a gate of a GAA FET.

In some embodiments, the interfacial layer 242 is silicon oxide formed on exposed surfaces of semiconductor materials in the gate trenches 238 by using, for example, thermal oxidation, chemical oxidation, wet oxidation or the like. As a result, surface portions of the nanosheets 204 exposed in the gate trenches 238 are oxidized into silicon oxide to form interfacial layer 242.

In some embodiments, the high-k gate dielectric layer 244 includes dielectric materials such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), the like, or combinations thereof.

In some embodiments, the gate metal layer 246 includes one or more metal layers. For example, the gate metal layer 246 may include one or more work function metal layers stacked one over another and a fill metal filling up a remainder of gate trenches 238. The one or more work function metal layers in the gate metal layer 246 provide a suitable work function for the high-k/metal gate structures 240. For an n-type GAA FET, the gate metal layer 246 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 246 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 18:
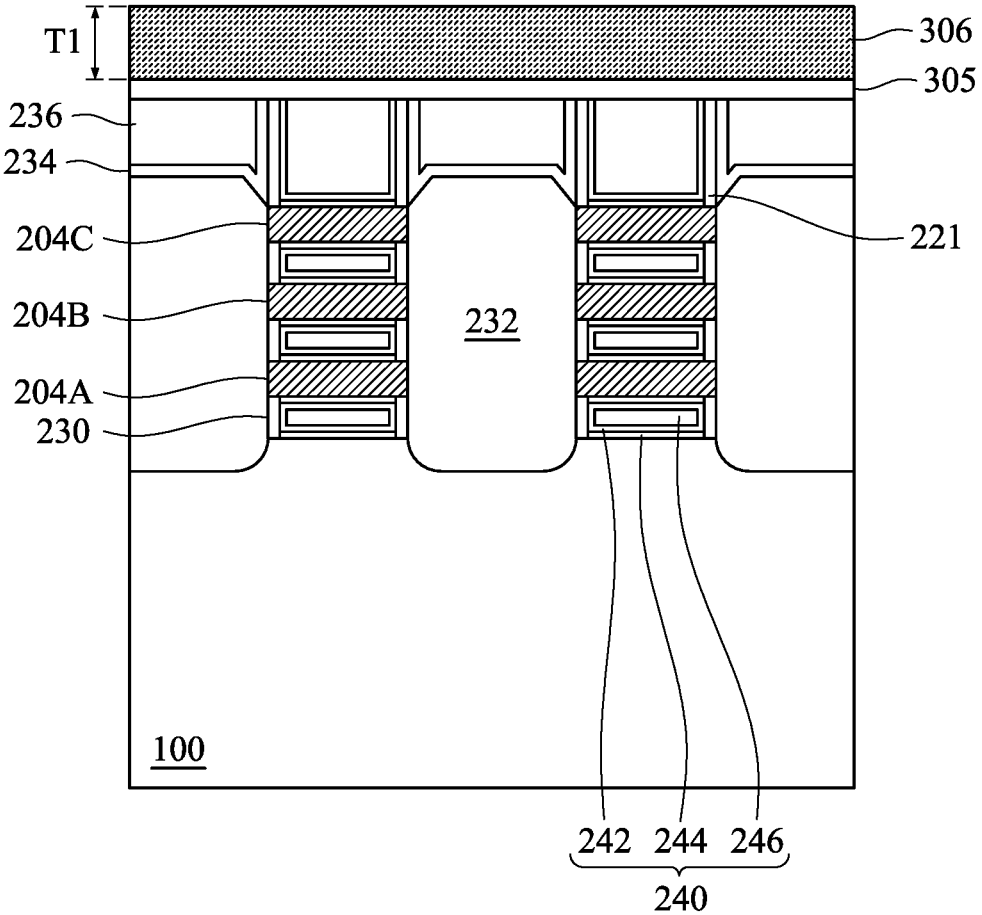

In FIG. 18, a contact etch stop layer (CESL) 305 is formed over the gate structure 240 and the epitaxial source/drain regions 232. An interlayer dielectric (ILD) layer 306 is directly formed over the CESL 305. In some embodiments, the ILD includes oxide or nitride, for example, silicon oxide or silicon nitride, and may be deposited or thermally grown according to acceptable techniques. In certain embodiments, the dielectric layer 306 is formed of silicon oxide (SiO$_x$). In some embodiments, the CESL 305 may comprise a dielectric material, such as, SiN, SiO$_x$, SiCN, SION, SiOCN, Al$_2$O$_3$, HfO$_2$, ZrO$_2$, HfAlO$_x$, and HfSiO$_x$, or the like, having a different etch rate than the material of the overlying ILD layer 306.

In FIG. 18, the ILD layer 306 has a thickness T1 in the vertical direction. In some embodiments, and the thickness T1 of the ILD layer 306 may be in a range between about 1 nm and about 30 nm.

Figure 19:
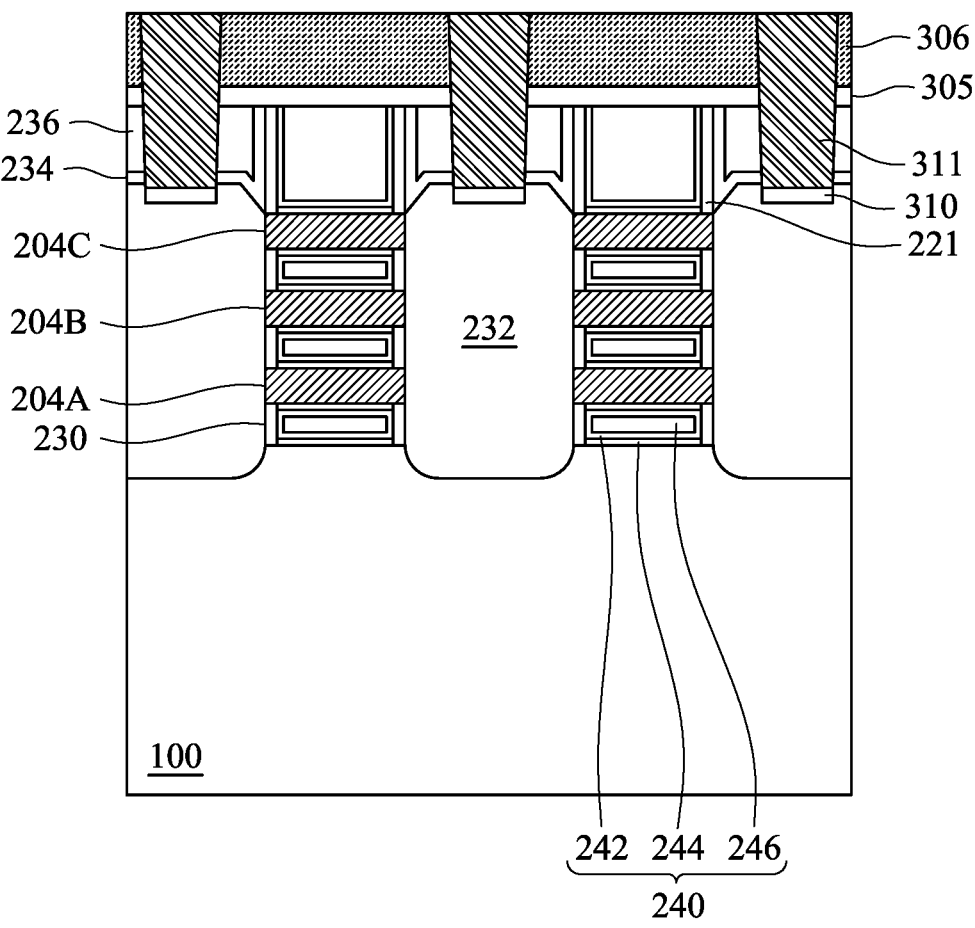

In FIG. 19, source/drain contacts 311 are formed over and electrically coupled to the epitaxial source/drain regions 232. In order to form the source/drain contacts 311, contact openings are formed through the ILD layer 306, the CESL 305, the ILD layer 236 and/or the CESL 234 to expose the epitaxial source/drain regions 232, and contact openings are then filled with electrically conductive material(s) to form the source/drain contacts 311.

In some embodiments, silicide regions 310 are formed over the epitaxial source/drain regions 232. The silicide regions 310 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the epitaxial source/drain regions 232, then performing a thermal anneal process to form the silicide regions 310. The un-reacted portions of the deposited metal are then removed, e.g., by an etching process. Although the silicide regions 310 are referred to as silicide regions, regions 310 may also be germanide regions, or silicon germanide regions (e.g., regions comprising silicide and germanide). In certain embodiments, the silicide regions 310 is formed of titanium silicide (TiSi).

Once the silicide regions 310 have been formed, a conductive material may be formed on the silicide regions 310, filling and overfilling the contact openings. The conductive material may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material Once the contact openings have been filled, excess portions of the conductive material outside of the contact openings may be removed through a planarization process such as CMP, although any suitable removal process may be used. The source/drain contacts 311 are thus formed in the contact openings and over the silicide regions 310. The source/drain contacts 311 are illustrated in a single cross-section as an example, and the source/drain contacts 311 could be in different cross-sections.

Figure 20:
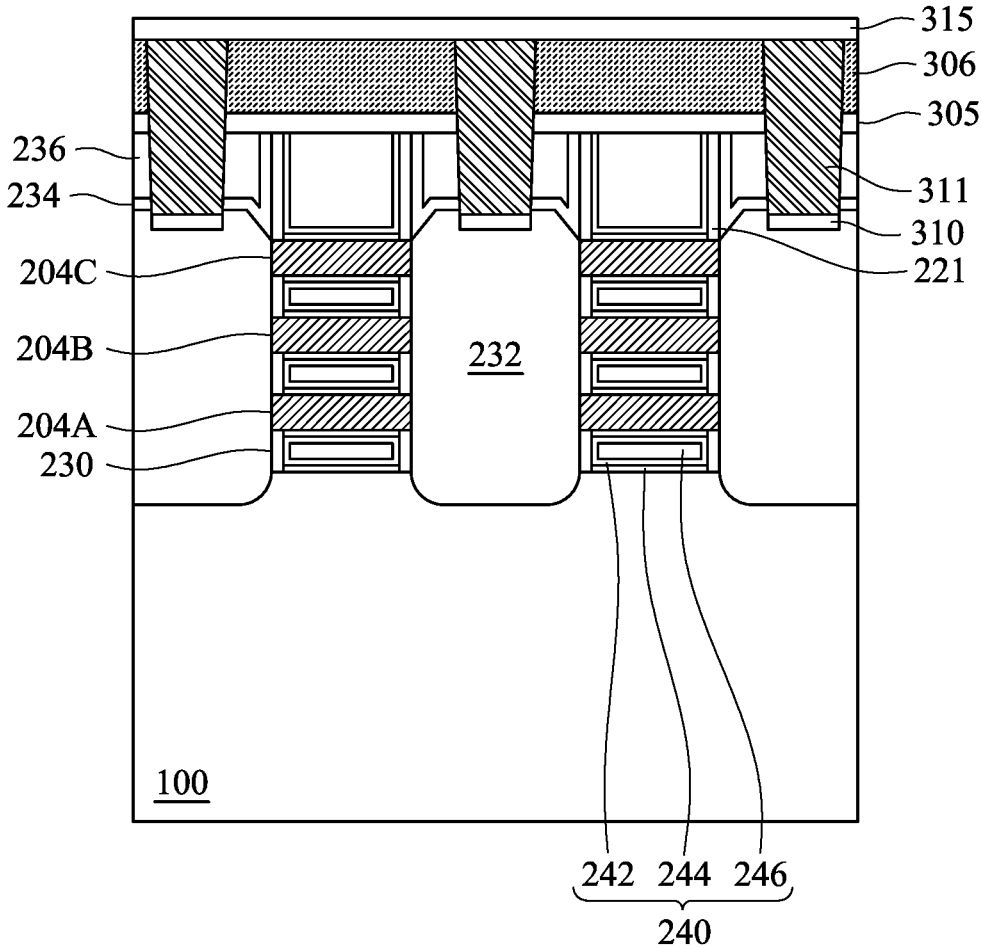

In FIG. 20, a mask layer 315 is formed over the dielectric layer 306. The mask layer 315 may be deposited over the ILD layer 306. In some embodiments, the mask layer 315 may include, for example, silicon nitride, silicon oxynitride, or the like.

Figure 21:
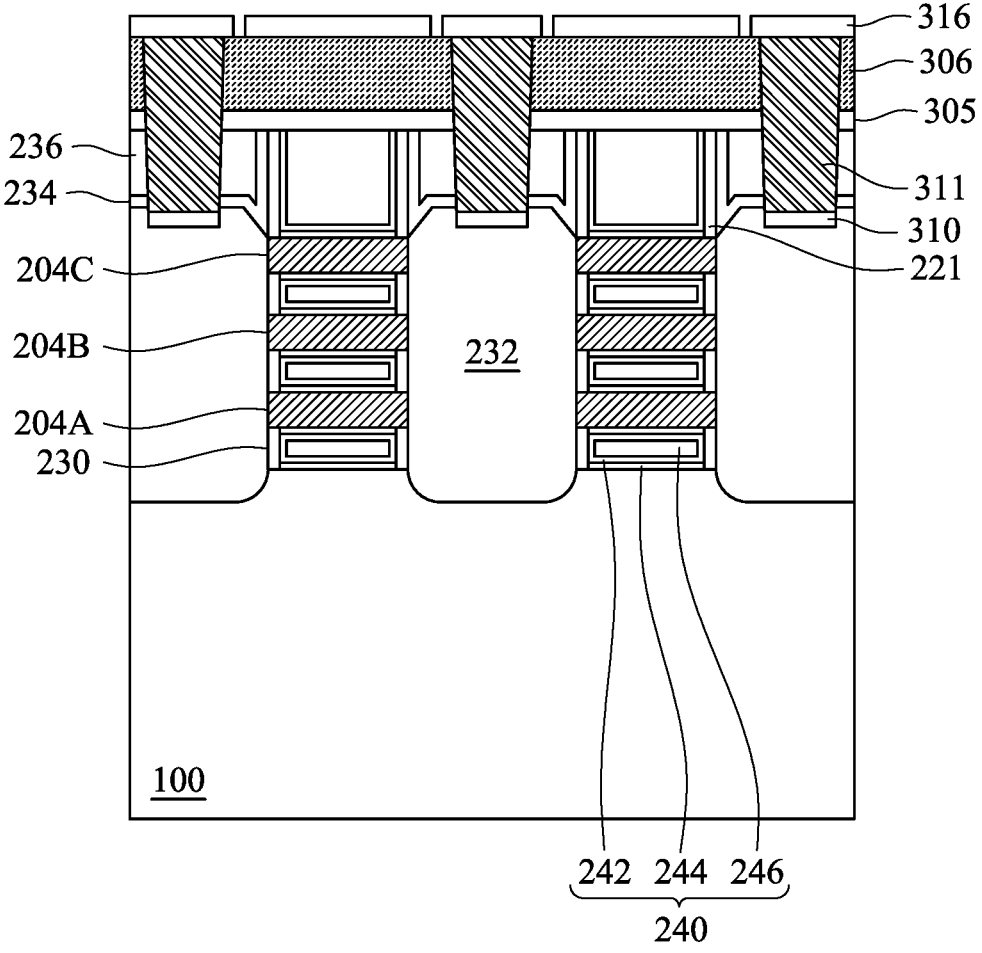
Figure 22:
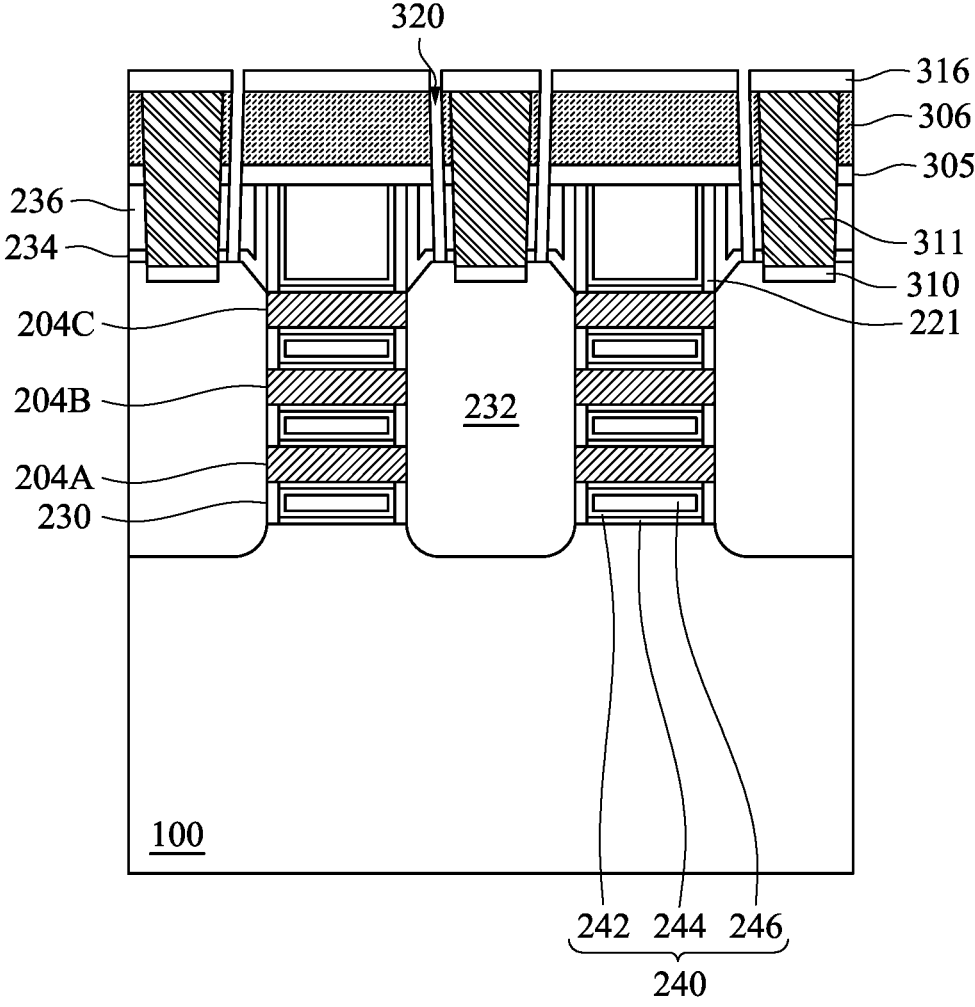
Figure 23:
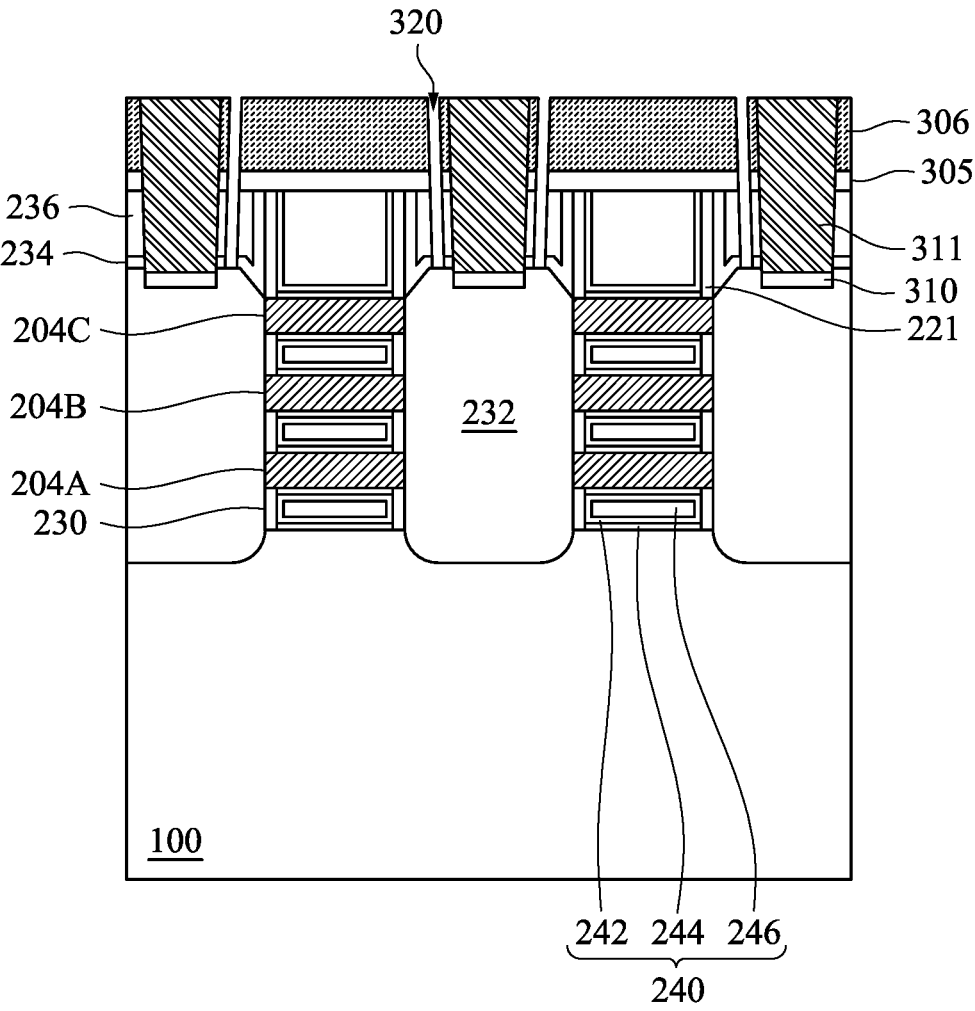

In FIG. 21, the mask layer 315 may be patterned using acceptable photolithography and etching techniques to form masks 316. The pattern of the masks 316 then may be transferred to the dielectric layer 306, the CESL 305, the ILD layers 236 and/or the CESL 234. The pattern of the masks 316 may be used to form structures physically separating each of the source/drain contacts 311 from adjacent source/drain contacts 311. In FIG. 22, a plurality of air gaps 320 are formed to separate each of the source/drain contacts 311 from adjacent source/drain contacts 311 based on the pattern of the mask 316. For example, the air gaps 320 may be formed by etching a plurality of openings in the ILD layer 236 and laterally between the source/drain contact 311 and the gate structure 240. The air gaps 320 extend to the epitaxial source/drain regions 232 through the ILD layer 306, the CESL 305, the ILD layers 236 and/or the CESL 234. The air gaps 320 are over the epitaxial source/drain regions 232 and between the source/drain contacts 311 and the gate structures 240. In the schematic cross-section view of FIG. 22, the source/drain contact 311 is between two-immediately-adjacent air gaps 320. The air gaps 320 extend adjacent bottoms of the source/drain contacts 311 and are higher than the silicide regions 310. After the air gaps 320 are formed, as illustrated in FIG. 23, the masks 316 are removed.

Figure 24:
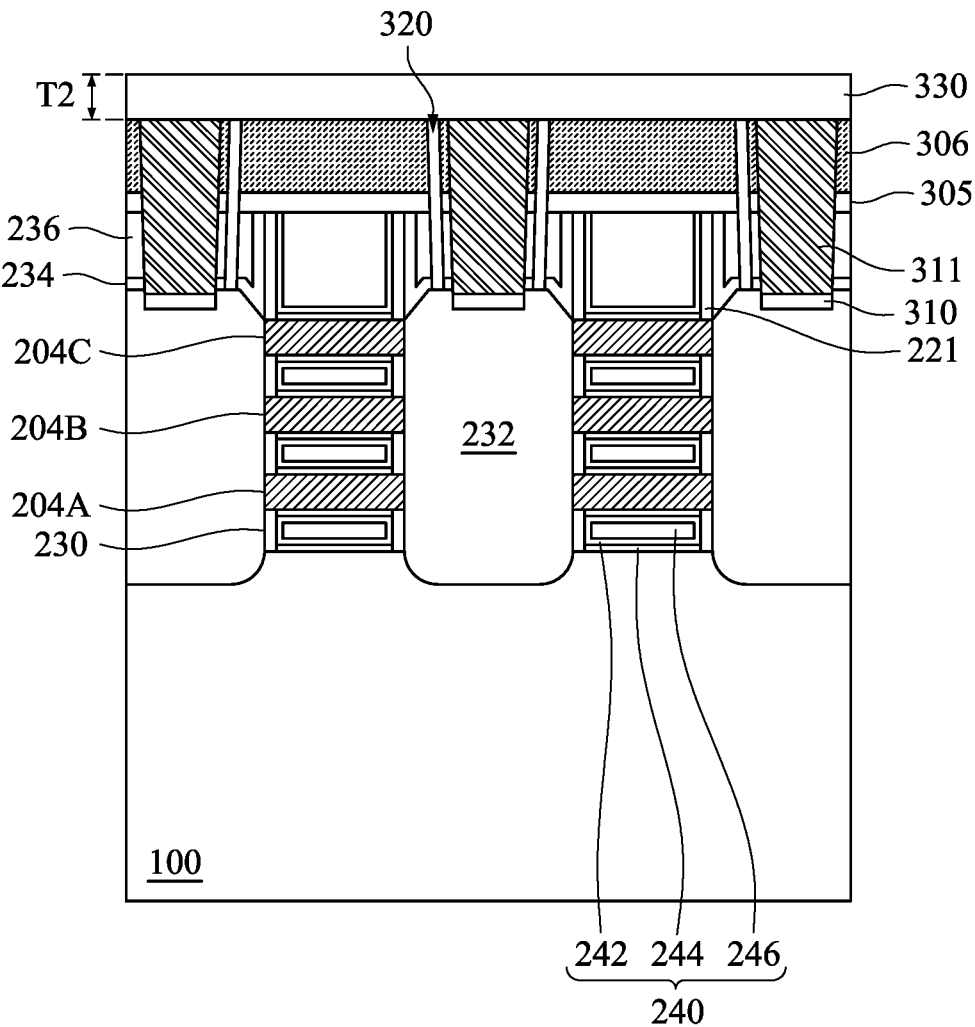

In FIG. 24, an implantation energy absorption dielectric layer 330 is directly formed over the ILD layer 306 and the air gaps 320. In some embodiments, the implantation energy absorption dielectric layer 330 includes oxide or nitride, for example, silicon oxide or silicon nitride, and may be deposited according to acceptable techniques. In certain embodiments, the implantation energy absorption dielectric layer 330 is formed of silicon oxide ($SiO_x$). In some embodiments, the air gaps 320 have a sufficient high aspect ratio (i.e., air gap depth to air gap width) so that the implantation energy absorption dielectric layer 330 will not fill the air gaps 320 once the deposition of the implantation energy absorption dielectric layer 330 is completed.

In FIG. 24, the implantation energy absorption dielectric layer 330 has a thickness T2 in the vertical direction. The thin dielectric layer 330 may serve to absorb some of the energy of the incoming ions in a subsequent ion implantation process IMP, thereby reducing the potential damage to the epitaxial materials of source/drain regions 232 and/or the channel regions 204. In some embodiments, the thickness T2 of the implantation energy absorption dielectric layer 330 is controlled in a range that allows the subsequent implantation process IMP can cause sufficient expansion to the ILD layer 306 while not damaging the source/drain regions 232 and/or the channel regions 204. For example, the thickness T2 of the implantation energy absorption dielectric layer 330 may be in a range between about 1 nm and about 30 nm. If the thickness T2 is excessively small (i.e., less than 1 nm), then the implantation process IMP may cause unwanted damages to the source/drain regions 232 and/or the channel regions 204. If the thickness T2 is excessively large (i.e., greater than 30 nm), then the implantation process IMP may cause insufficient expansion to the ILD layer 306, thus causing potential failure in sealing the air gaps 320 by the ILD expansion.

Figure 25:
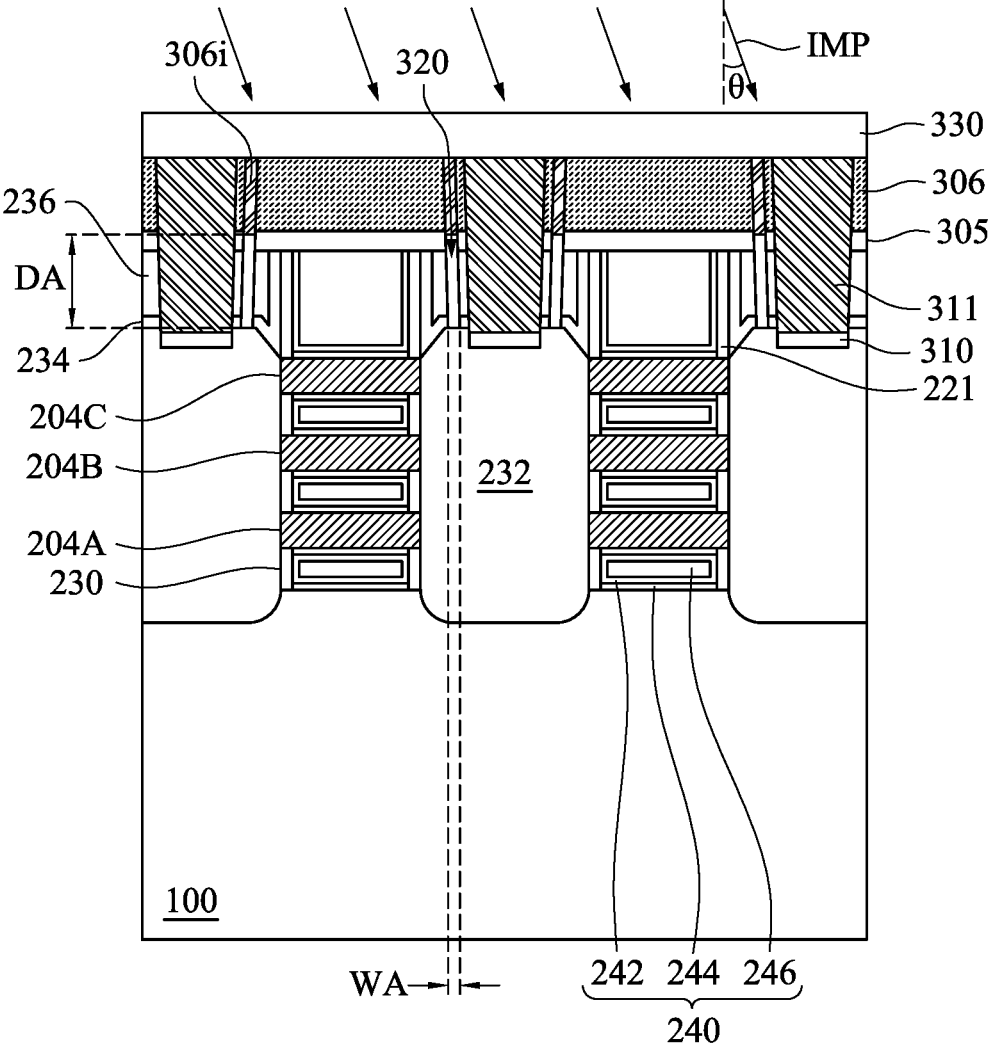

After the implantation energy absorption dielectric layer 330 is formed, in FIG. 25, an implantation process IMP is performed on the implantation energy absorption dielectric layer 330. Some of the implanted ions migrate through the implantation energy absorption 330 to the ILD layer 306. The ions migrating into the ILD layer 306 can cause expansion of the material of dielectric layer 306, forming a plurality of dielectric expansion portions 306i extending into the air gaps 320 and sealing the air gaps 320. In one or more embodiments of the present disclosure, the dopants of the implantation process IMP of the dielectric layers 306 and 330 may be germanium (Ge). The dielectric expansion portions 306i of the ILD layer 306 seal the air gaps 320, thus forming void spaces or hollow spaces between the source/drain contacts 311 and the gates structures 240. In other words, the dielectric expansion portions 306i extend to the openings in the ILD layer 236 and laterally between the source/drain contact 311 and the gate structure 240, and the void spaces or hollow spaces are formed between the source/drain contacts 311 and the gates structures 240 and can be regarded as the air gaps 320. In some embodiments, the region of the void spaces or hollow spaces may be filled with an ambient gas. The dielectric expansion portions 306i are expanded from the ILD layer 306. In FIG. 25, the dielectric expansion portions 306i are over tops of the air gaps 320. In some embodiments, as shown in FIG. 25, the dielectric expansion portions 306i extend within the CESL 305 and have the bottom ends lower than a bottom surface of the ILD layer 306.

Figure 26:
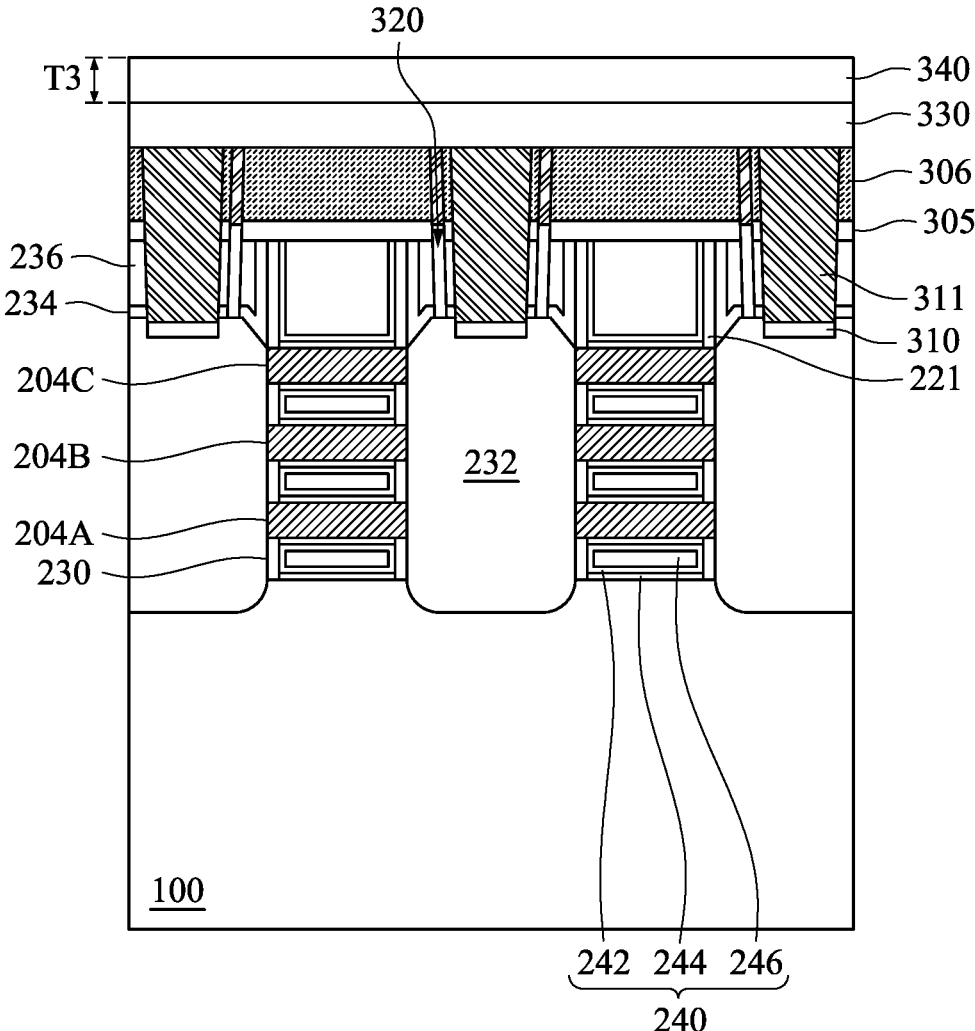

Reference is made to FIGS. 25 and 26. In some embodiments, implantation process IMP can be a low energy/dosage implantation process. For example, an impurity concentration (e.g., germanium atomic concentration) caused by the ion implantation process IMP may be zero or negligible at bottoms of the air gaps 320.

In some embodiments, after the dielectric layers 306 and 330 are implanted, the impurity concentration in the dielectric layers 306 and 330 may be in a range between about $10^{19}$ atoms/cm$^3$ and about $2\times10^{22}$ atoms/cm$^3$. A depth of an implant region of the dielectric layers 306 and 330 may be in a range between about 1 nm and about 30 nm measured from a top surface of the implantation energy absorption dielectric layer 330 downwards in the vertical direction. The impurity concentration at the bottoms of the air gaps 320 may be lower than a concentration of $10^{18}$ atom/cm$^3$.

Reference is made to FIG. 25. In some embodiments, implanted species of the implantation process IMP may include germanium (Ge), xenon (Xe), argon (Ar), silicon (Si), phosphorus (P), boron (B), etc. Implanted energy of the implantation process IMP may be in a range between about 1 keV and about 50 keV. Dosage of the implantation process IMP may be in a between $10^{14}$ atoms/cm$^2$ and $10^{16}$ atoms/cm$^2$. As illustrated in FIG. 25, the implantation process IMP can be a tilt implantation. In some embodiments, ion beams of the implantation process IMP may have a tilt angle θ with respect to direction z and in a range between 0 degree and about 60 degrees. In some embodiments, the implantation process IMP may be a low-temperature implantation. A temperature for the implantation process IMP may be about −100° C. to about 500° C.

As shown in FIG. 25, the air gaps 320 are between the gate structures 240 and the source/drain contact 311. The air gaps 320 extend to the epitaxial source/drain regions 232 from bottom surfaces of the dielectric layer 306 through the dielectric layer 306, the CESL 305, the ILD layer 236 and the CESL 234. Bottoms of the air gaps 320 are higher than tops of the silicide regions 310.

In FIG. 25, each of the air gaps 320 has a width WA in the horizontal direction and a depth DA in the vertical direction. The width WA of each the air gaps 320 may be in range between about 1 nm and about 3 nm. The depth DA of each the air gaps 320 may be in range between about 1 nm and about 30 nm.

After the air gaps 320 are sealed by the dielectric expansion portions 306i of the ILD layer 306, one or more implant-free dielectric layers may be formed over the implantation energy absorption dielectric layer 330. In FIG.

26, an implant-free dielectric layer 340 is formed over the implantation energy absorption dielectric layer 330. In some embodiments, the implant-free dielectric layer 340 includes oxide or nitride, for example, silicon oxide or silicon nitride, and may be deposited according to acceptable techniques. In some embodiments, the dielectric layers 306 and 330 are implanted with Ge, and a concentration of Ge of the implant-free dielectric layer 340 is less than the implanted dielectric layers 306 and 330. In some embodiments, the combination of the implantation energy absorption dielectric layer 330 and the implant-free dielectric layer 340 functions as an etch stop layer, slowing down a subsequent etching process utilized in source/drain via formation. This arrangement allows the implantation energy absorption dielectric layer 330 to have a reduced thickness without compromising the integrity of the etch stop layer. Even with a reduction in thickness to facilitate sufficient expansion in the ILD 306 by using a reduced energy/dosage implantation process IMP, the additional implant-free dielectric layer 340 compensates for the reduction, ensuring that a sufficiently thick etch stop layer is formed to control the subsequent etching process used in source/drain via formation. In some embodiments, the dielectric layers 330 and 340 are nitride-based materials (e.g., silicon nitride), different from a material of underlying ILD layer 306 (e.g., silicon oxide).

In FIG. 26, the implant-free dielectric layer 340 has a thickness T3 in the vertical direction. In some embodiments, the thickness T3 of the implant-free dielectric layer 340 may be in a range between about 1 nm and about 30 nm. In some embodiments, the thickness T3 of the implant-free dielectric layer 340 is greater than the thickness T2 of the implantation energy absorption dielectric layer 330, because the implant-free dielectric layer 340 does not serve for allowing sufficient ILD expansion caused by the low energy implantation process IMP. However, in some other embodiments, the thickness T3 of the implant-free dielectric layer 340 can be less than the thickness T2 of the implantation energy absorption dielectric layer 330. In some embodiments, the implant-free dielectric layer 340 can be formed of a different material than the implantation energy absorption dielectric layer 330, or a same material as the implantation energy absorption dielectric layer 330.

Figure 27:
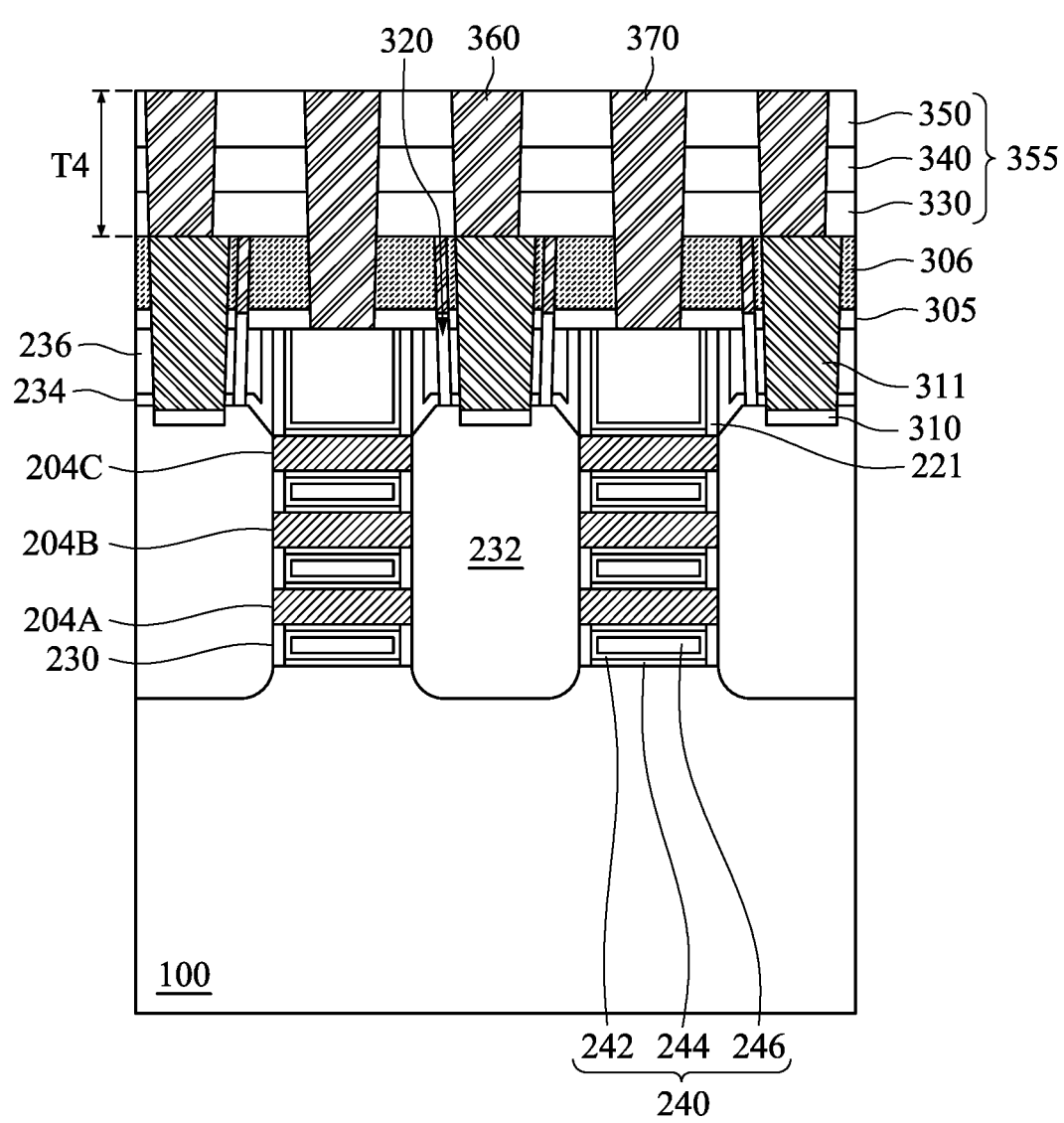

In FIG. 27, another implant-free dielectric layer 350 is formed over the implant-free dielectric layer 340. In some embodiments, the dielectric layer 350 includes oxide or nitride, for example, silicon oxide or silicon nitride, and may be deposited or thermally grown according to acceptable techniques. In one or more embodiments of the present disclosure, the implantation energy absorption dielectric layer 330, the implant-free dielectric layer 340 and the dielectric layer 350 may be commonly regarded as a multi-layer dielectric film 355. In some embodiments, the implant-free dielectric layer 350 can serve as another ILD layer over the etch stop layer consisting of the implantation energy absorption dielectric layer 330, the implant-free dielectric layer 340. In some embodiments, the dielectric layer 350 is formed of a different material than the dielectric layers 330 and 340. For example, the dielectric layer 350 may be an oxide-based material (e.g., silicon oxide), and the dielectric layers 330 and 340 may be a different material (e.g., silicon nitride) than the oxide-based material, which allows for slowing down a subsequent etching process utilized in source/drain via formation.

In FIG. 27, the implant-free dielectric layer 340 is between the implantation energy absorption dielectric layer 330 and the dielectric layer 350. In one or more embodiments, the multi-layer dielectric film 355 may include ore or more implant-free dielectric layers 340. In some embodiments, the multi-layer dielectric film 355 may include up to four implant-free dielectric layers 340, depending on a target thickness of the multi-layer dielectric film 355. A number of the dielectric layers between the ILD layer 306 and the dielectric layer 350 may be in a range between 2 and 5. The implant-free dielectric layers 340 between the implantation energy absorption dielectric layer 330 and the dielectric layer 350 may have an impurity concentration caused by the implantation process IMP (e.g., Ge) less than that of the implantation energy absorption dielectric layer 330.

As shown in FIG. 27, after the multi-layer dielectric film 355 is formed, a plurality of source/drain vias 360 are formed in the multi-layer ILD film to the source/drain contacts 311, and a plurality of gate vias 370 are formed extending through the multi-layer dielectric film 355, the underlying ILD layer 306 and the CESL 305 to the gate structure 240. The source/drain vias 360 and gate vias 370 are formed by etching openings through the dielectric films 355, followed by depositing one or more metals in the openings, followed by performing a CMP process to remove excessive metals outside the openings. In such etching operation, the dielectric layers 330 and 340 can collectively serve as an etch stop layer to prevent unwanted damages to the source/drain contacts 311 and dielectric expansion portions 306i. The source/drain vias 360 extend to the source/drain contacts 311 through the dielectric layer 350, the implant-free dielectric layer 340 and the implantation energy absorption dielectric layer 330. The gate vias 370 extend to the gate structure 240 through the dielectric layer 350, the implant-free dielectric layer 340, the implantation energy absorption dielectric layer 330, the ILD layer 306, and the CESLs 305.

In one or more embodiments of the present disclosure, the source/drain vias 360 and the gate vias 370 may include W, Ti, TiAlC, Al, TiAl, TaN, TaAlC, TiN, TiC, Co, TaC, Al, TiAl, HfTi, TiSi, TaSi, TiAlC, combinations thereof, or the like. The source/drain vias 360 and the gate vias 370 may be formed by chemical vapor deposition (CVD), physical vapor deposition (PVD) including sputtering, atomic layer deposition (ALD) or other suitable method. In some embodiments, the source/drain vias 360 and the gate vias 370 may be formed in the same or different processes.

Figure 28:
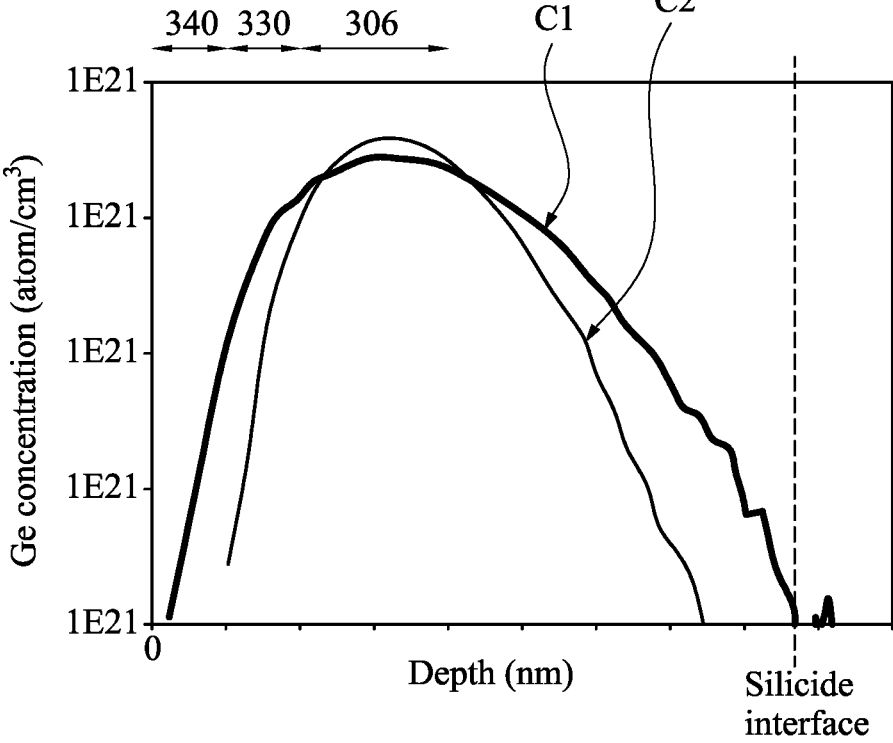
FIG. 28 is a diagram of depths of the multi-layer dielectric layers and implant concentrations according to one or more embodiments of the present disclosure.

FIG. 28 is a simulation result of germanium concentration distribution caused by an example ion implantation process IMP, wherein the germanium concentration is shown on the vertical axis in FIG. 28, and a depth measured from a bottom surface of the dielectric layer 350 is shown on the horizontal axis in FIG. 28. The curve C1 represents a Ge concentration profile caused by a typical implantation process, and the curve C2 represents a Ge concentration profile caused by a low energy/dosage implantation process IMP as described in FIG. 25. Comparing the curve C2 with the curve C1, it can be observed that the low energy/dosage implantation process IMP performed on the thinned implantation energy absorption dielectric layer 330 causes no or negligible Ge concentration at the silicide interface (i.e., interface between the silicide region 310 and the source/drain region 232), while the typical implantation process causes a significantly high Ge concentration at the silicide interface. This simulation result proves that the low energy/dosage implantation process IMP performed on the thinned implantation energy absorption dielectric layer 330 can prevent unwanted damage to the silicide region 310 and/or the source/drain region 232.

Figure 29A:
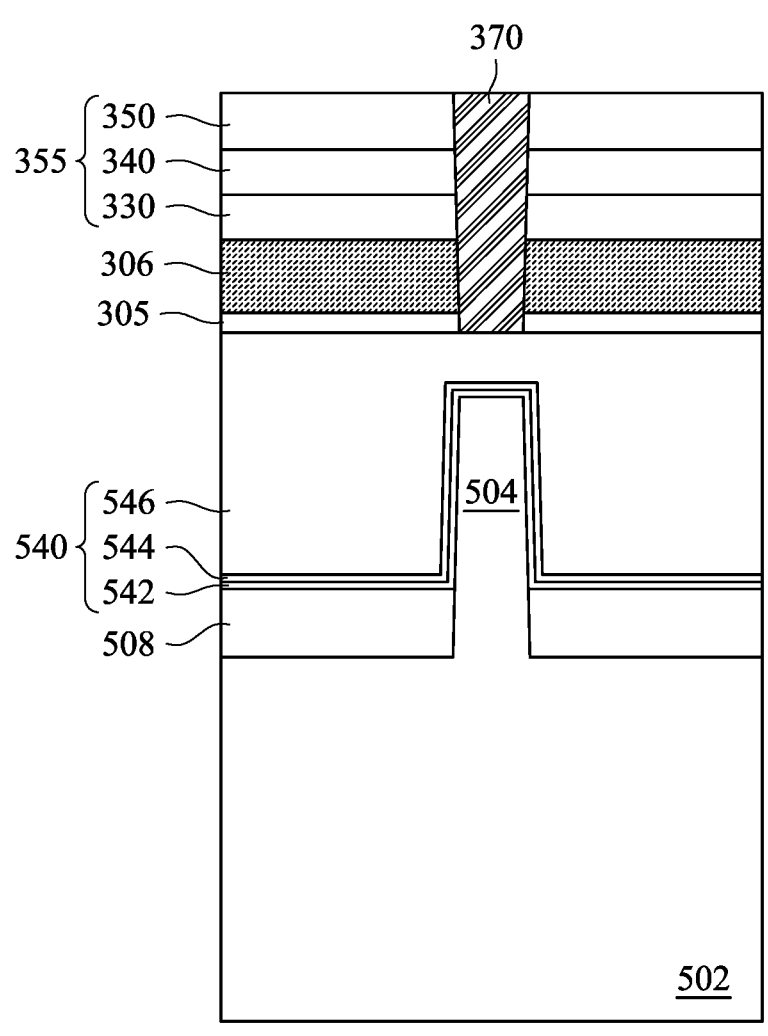
FIGS. 29A and 29B illustrate schematic cross-section views of a device having semiconductor fin according to one or more embodiments of the present disclosure.
Figure 29B:
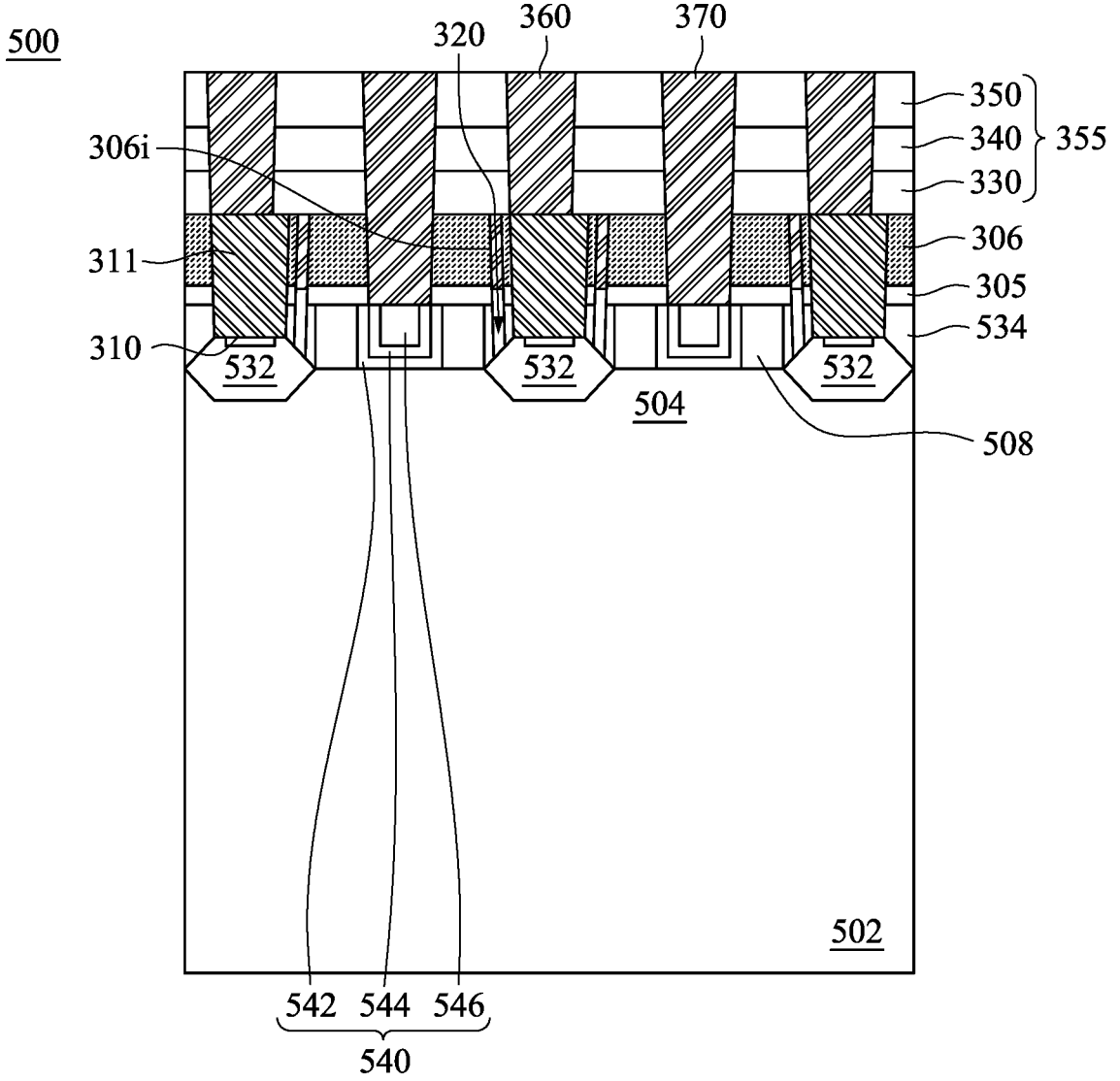

FIGS. 29A and 29B illustrate schematic cross-section views of a device 500 according to one or more embodiments of the present disclosure. The device 500 is a FinFET device having a semiconductor fin (e.g., fin 504) and including air gaps 320 and multi-layer dielectric layer 355. FIG. 29A illustrates a schematic cross-section view across the fin 504. FIG. 29B illustrates a schematic cross-section view extending through the fin 504 along a lengthwise direction of the fin 504.

In FIGS. 29A and 29B, the device 500 includes a fin 504 a substrate 502. The device 500 includes epitaxial source/drain regions 532 over the fin 504 and gate structures 540 over the fin 504 and spaced apart the epitaxial source/drain regions 532. Each of the gate structures 540 includes an interfacial layer 542 over the fin 504, a high-k gate dielectric layer 544 over the interfacial layer 542 and a gate metal layer 546 over the high-k gate dielectric layer 544. The device 500 includes isolation structures 508 between the gate structures 540 and the epitaxial source/drain regions 532. The device 500 includes interlayer dielectric (ILD) layers 534 over the epitaxial source/drain regions 532. The device 500 includes a contact etch stop layer (CESL) 305 over the ILD layers 534 and the isolation structures 508. The device 500 includes source/drain contacts 311 extending to the epitaxial source/drain regions 532. In some embodiments, the device 500 includes silicide regions 310 between the source/drain contacts 311 and the epitaxial source/drain regions 532. The device 500 further includes a plurality of air gaps 320 and a multi-layer dielectric film 355. The air gaps 320 are adjacent the source/drain contacts 311 and extend to the epitaxial source/drain regions 532. The multi-layer dielectric film 355 includes a dielectric layer 330 having an implant concentration, an implant-free dielectric layer 340 having an implant concentration less than the implant concentration of the implantation energy absorption dielectric layer 330 and the dielectric layer 350. The ILD layer 306 is also implanted and has a plurality of dielectric expansion portions 306i sealing the air gaps 320. The device 500 further includes source/drain vias 360 electrically coupled to the epitaxial source/drain regions 532 and gate vias electrically coupled to the gate structures 540.

In FIGS. 29A and 29B, the air gaps 320 can be sealed by an implantation process to the implantation energy absorption dielectric layer 330 and the ILD layer 306. The ILD layer 306 expands and has the dielectric expansion portions 306i extending to the air gaps 320 after the implantation process to the ILD layer 306 is performed. In some embodiments, the thickness of the implantation energy absorption dielectric layer 330 is thin and the implantation process to the ILD layer 306 can be a low energy implantation, so that depth of implant can be controlled and damage at an interface between the silicide regions 310 and the source/drain contacts 311 can be reduced.

According to one or more embodiments of the present disclosure, a method includes a number of operations. An interlayer dielectric (ILD) layer is formed over a source/drain region on a substrate. A source/drain contact is formed and extends through the ILD layer to electrically connect with the source/drain region. An air gap is formed and extends through the ILD layer. An implantation energy absorption dielectric layer is formed over the interlayer dielectric layer. An implantation process is performed on the implantation energy absorption dielectric layer, wherein the implantation process causes the ILD layer expands to seal the air gap. A first implant-free dielectric layer is formed over the implantation energy absorption dielectric layer. A second implant-free dielectric layer is formed over the first implant-free dielectric layer. A source/drain via is formed and extends through the second implant-free dielectric layer, the first implant-free dielectric layer, and the implantation energy absorption dielectric layer to the source/drain contact. In one or more embodiments of the present disclosure, the method further includes a number of operations. A gate structure is formed over the substrate and spaced apart from the source/drain region. A gate via is formed and extends through the second implant-free dielectric layer, the first implant-free dielectric layer, and the implantation energy absorption dielectric layer to the gate structure. In some embodiments, the air gap is formed between the gate structure and the source/drain contact. In some embodiments, after the ILD layer expands to seal the air gap, the sealed air gap has a top end higher than a top surface of the gate structure. In one or more embodiments of the present disclosure, the implantation process implants germanium into the ILD layer. In one or more embodiments of the present disclosure, the air gap has a bottom end higher than a bottom surface of the source/drain contact. In one or more embodiments of the present disclosure, the method further includes forming a silicide region over the source/drain region, wherein the source/drain contact is formed over the silicide region, and the air gap has a bottom end higher than an interface between the silicide region and the source/drain contact.

According to one or more embodiments of the present disclosure, a method includes a number of operations. A source/drain region is formed over a substrate. A gate structure is formed adjacent the source/drain region. An interlayer dielectric (ILD) layer is formed over the source/drain region. A source/drain contact is formed and extends through the ILD layer to electrically connect with the source/drain region. An opening is etched in the ILD layer and laterally between the source/drain contact and the gate structure. A first dielectric layer is formed over the ILD layer. An implantation process is performed on the first dielectric layer, the implantation process forming a dielectric expansion portion filling an upper portion of the opening, while leaving a lower portion of the opening unfilled. After performing the implantation process, a plurality of second dielectric layers is formed over the first dielectric layer. A source/drain via is formed and extends through the plurality of second dielectric layers and the first dielectric layer to the source/drain contact. In one or more embodiments of the present disclosure, a bottom surface of the source/drain via has a portion non-overlapping with the source/drain contact. In one or more embodiments of the present disclosure, a bottom surface of the source/drain via has a portion overlapping with the dielectric expansion portion. In one or more embodiments of the present disclosure, the method further includes forming a silicide region over the source/drain region, wherein the source/drain contact is formed over the silicide region, and the unfilled portion of the opening has a bottom above a top surface of the silicide region. In one or more embodiments of the present disclosure, the dielectric expansion portion has a bottom end lower than a bottom surface of the ILD layer. In one or more embodiments of the present disclosure, an impurity concentration profile caused by the implantation process has a peak value within the ILD layer.

According to one or more embodiments of the present disclosure, a device includes a source/drain region, a gate structure, a first ILD layer, a second ILD layer, a source/drain contact, a void region, a multi-layer film and a source/drain via. The source/drain region is over a substrate. The gate structure is adjacent the source/drain region. The first ILD layer is over the source/drain region. The second ILD layer is over the first ILD layer. The source/drain contact extends through the first ILD layer and the second ILD layer to electrically connect with the source/drain region. The void region extends in the first ILD layer and laterally between the gate structure and the source/drain contact. The void region is filled with an ambient gas. The multi-layer film is over the source/drain contact. The multi-layer film includes a doped dielectric layer and a plurality of un-doped dielectric layers over the doped dielectric layer. The source/drain via extends through the plurality of un-doped dielectric layers and the doped dielectric layer to the source/drain contact. In one or more embodiments of the present disclosure, the doped dielectric layer is doped with germanium. In one or more embodiments of the present disclosure, the void region has a bottom higher than a bottom end of the source/drain contact. In one or more embodiments of the present disclosure, the void region has a top lower than a bottom surface of the second ILD layer. In one or more embodiments of the present disclosure, the device further includes a dielectric expansion feature capping the void region. In some embodiments, the dielectric expansion feature is expanded from the second ILD layer. In some embodiments, the device further includes a silicide region between the source/drain region and the source/drain contact. The void region has a bottom higher than a top surface of the silicide region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an interlayer dielectric (ILD) layer over a source/ drain region on a substrate;
   forming a source/drain contact extending through the ILD layer to electrically connect with the source/drain region;
   forming an air gap extending through the ILD layer;
   forming an implantation energy absorption dielectric layer over the ILD layer;
   performing an implantation process on the implantation energy absorption dielectric layer, wherein the implantation process causes the ILD layer expands to seal the air gap;
   forming a first implant-free dielectric layer over the implantation energy absorption dielectric layer;
   forming a second implant-free dielectric layer over the first implant-free dielectric layer; and
   forming a source/drain via extending through the second implant-free dielectric layer, the first implant-free dielectric layer, and the implantation energy absorption dielectric layer to the source/drain contact.

2. The method of claim 1, further comprising:
   forming a gate structure over the substrate and spaced apart from the source/drain region; and
   forming a gate via extending through the second implant-free dielectric layer, the first implant-free dielectric layer, and the implantation energy absorption dielectric layer to the gate structure.

3. The method of claim 2, wherein the air gap is formed between the gate structure and the source/drain contact.

4. The method of claim 2, wherein after the ILD layer expands to seal the air gap, the sealed air gap has a top end higher than a top surface of the gate structure.

5. The method of claim 1, wherein the implantation process implants germanium into the ILD layer.

6. The method of claim 1, wherein the air gap has a bottom end higher than a bottom surface of the source/drain contact.

7. The method of claim 1, further comprising:
   forming a silicide region over the source/drain region, wherein the source/drain contact is formed over the silicide region, and the air gap has a bottom end higher than an interface between the silicide region and the source/drain contact.

8. A method comprising:
   forming a source/drain region over a substrate;
   forming a gate structure adjacent the source/drain region;
   forming an interlayer dielectric (ILD) layer over the source/drain region;
   forming a source/drain contact extending through the ILD layer to electrically connect with the source/drain region;
   etching an opening in the ILD layer and laterally between the source/drain contact and the gate structure;
   forming a first dielectric layer over the ILD layer;
   performing an implantation process on the first dielectric layer, the implantation process forming a dielectric expansion portion filling an upper portion of the opening, while leaving a lower portion of the opening unfilled;
   after performing the implantation process, forming a plurality of second dielectric layers over the first dielectric layer; and
   forming a source/drain via extending through the plurality of second dielectric layers and the first dielectric layer to the source/drain contact.

9. The method of claim 8, wherein a bottom surface of the source/drain via has a portion non-overlapping with the source/drain contact.

10. The method of claim 8, wherein a bottom surface of the source/drain via has a portion overlapping with the dielectric expansion portion.

11. The method of claim 8, further comprising:
   forming a silicide region over the source/drain region, wherein the source/drain contact is formed over the silicide region, and the unfilled portion of the opening has a bottom above a top surface of the silicide region.

12. The method of claim 8, wherein the dielectric expansion portion has a bottom end lower than a bottom surface of the ILD layer.

13. The method of claim 8, wherein an impurity concentration profile caused by the implantation process has a peak value within the ILD layer.

14. A device comprising:
   a source/drain region over a substrate;
   a gate structure adjacent the source/drain region;
   a first ILD layer over the source/drain region and a second ILD layer over the first ILD layer;
   a source/drain contact extending through the first ILD layer and the second ILD layer to electrically connect with the source/drain region;
   a void region extending in the first ILD layer and laterally between the gate structure and the source/drain contact, the void region being filled with an ambient gas, wherein the void region has a top lower than a bottom surface of the second ILD layer;

a multi-layer film over the source/drain contact, the multi-layer film comprising a doped dielectric layer and a plurality of un-doped dielectric layers over the doped dielectric layer; and a source/drain via extending through the plurality of un-doped dielectric layers and the doped dielectric layer to the source/drain contact.

15. The device of claim 14, wherein the doped dielectric layer is doped with germanium.

16. The device of claim 14, wherein the void region has a bottom higher than a bottom end of the source/drain contact.

17. The device of claim 14, further comprising:

a dielectric expansion feature capping the void region.

18. The device of claim 17, wherein the dielectric expansion feature is expanded from the second ILD layer.

19. The device of claim 18, further comprising:

a silicide region between the source/drain region and the source/drain contact, wherein the void region has a bottom higher than a top surface of the silicide region.

20. The device of claim 14, wherein the void region extends to the source/drain region.

* * * * *